United States Patent [19]
Kyouno et al.

[11] Patent Number: 5,384,856
[45] Date of Patent: Jan. 24, 1995

[54] ACOUSTIC SYSTEM

[75] Inventors: Noboru Kyouno; Yoshiharu Osuga; Noboru Yashima, all of Kyoto, Japan

[73] Assignee: Mitsubishi Denki Kabushiki Kaisha, Tokyo, Japan

[21] Appl. No.: 693,454

[22] Filed: Apr. 29, 1991

[30] Foreign Application Priority Data

Jan. 21, 1991 [JP] Japan ............................ 3-004842
Jan. 23, 1991 [JP] Japan ......................... 3-001564[U]
Jan. 30, 1991 [JP] Japan ......................... 3-002603[U]

[51] Int. Cl.$^6$ ............................................ H03G 5/00
[52] U.S. Cl. ..................................... 381/103; 381/1; 381/17; 381/63; 381/99
[58] Field of Search .................... 381/1, 17, 63, 103, 381/99

[56] References Cited

U.S. PATENT DOCUMENTS

| | | | |
|---|---|---|---|
| 4,130,726 | 12/1978 | Kates et al. ........................ | 381/98 |
| 4,472,834 | 9/1984 | Yamamuro et al. ................. | 381/63 |
| 4,683,590 | 7/1987 | Miyoshi et al. .................... | 381/71 |
| 4,751,739 | 6/1988 | Serikawa et al. .................. | 381/103 |
| 4,870,690 | 9/1989 | Negishi et al. .................... | 381/103 |
| 4,888,811 | 12/1989 | Takashi ............................. | 381/99 |
| 4,991,221 | 2/1991 | Rush ................................. | 381/100 |
| 5,058,170 | 10/1991 | Kanamori et al. ................. | 381/92 |
| 5,068,897 | 11/1991 | Yamato et al. .................... | 381/24 |

FOREIGN PATENT DOCUMENTS

| | | |
|---|---|---|
| 61-142900 | 12/1985 | Japan ................................ 381/97 |
| 63-269699 | 11/1988 | Japan . |
| 2-6673 | 2/1990 | Japan . |

*Primary Examiner*—John K. Peng
*Assistant Examiner*—Edward Lefkowitz
*Attorney, Agent, or Firm*—Wolf, Greenfield & Sacks

[57] ABSTRACT

In a digital channel divider of the present invention, a plurality of filters are connected in parallel, which can set a desired transmission frequency response optionally for a digital input signal, so that signals outputted from each filter are outputted independently. In order to flatten the amplitude characteristic of an overall transmission frequency response of each channel and to obtain a linear phase frequency response, a time series impulse response is calculated based on an inverse characteristic and this time series impulse response is made to be a filter factor, and this filter factor and and the digital input signal are calculated by convolution operations.

27 Claims, 18 Drawing Sheets

5,384,856

ACOUSTIC SYSTEM

BACKGROUND OF THE INVENTION

1. Field of the Invention

The present invention relates to acoustic systems.

2. Description of the Prior Art

Conventionally, in a multi-way speaker system using a plurality of combined speakers dedicated for use in a frequency band, for example, have been employed a system where an LC network comprising coils and capacitors or a multi-channel amplifier system where a channel divider dedicated for use in each frequency band (channel) is used. Both the LC network and the channel divider used in multi-channel amplifier systems have such a function that the audible frequency band is divided into some necessary frequency bands and acoustic signals are supplied to the speaker dedicated for use in corresponding frequency bands.

In the multi-channel amplifier system, a digital version of channel divider comprising electronic circuits has been worked out. FIG. 21 is a block diagram which shows one embodiment of channel divider disclosed in the Japanese Utility Model Publication No. 2-6673. FIG. 21 illustrates an example of speaker systems based on the above-mentioned multi-channel amplifier system. In FIG. 21, reference numbers 2, $2_1, 2_2, \ldots 2n$ represent a plurality of power amplifiers and 3, $3_1, 3_2, \ldots 3n$ represent a plurality of speaker units and also 4 represents a channel divider (frequency band dividing circuit) comprising a plurality of linear-phase FIR type filters $4_1, 4_2, \ldots 4n$. Reference numbers $4_{11}, 4_{22}, \ldots 4nn$ each represent a plurality of filter-factor variable devices which are operating means to give a filter factor in order to give a desired frequency-band dividing characteristics to the above-mentioned linear-phase FIR type filters. Reference numbers 5, $5_1, 5_2, \ldots 5n$ represent a plurality of D/A converters.

In the above-mentioned multi-way speaker system, digital signal inputs are applied to the channel divider 4, in which those input signals undergo convolution operations with the filter factor of the filter factor variable devices $4_{11}, 4_{22}, \ldots 4nn$ by the linear phase FIR type filters $4_1, 4_2, \ldots 4nn$, so that the system may be given desired frequency band dividing characteristics. Next, the outputs of the linear phase FIR type filters 4, $4_1, 4_2, \ldots 4n$ are each converted into analog signals at the corresponding D/A converters 5, $5_1, 5_2, \ldots 5n$. Those analog signals are then amplified to a predetermined level at the power amplifiers 2, $2_1, 2_2, \ldots 2n$, so that they can be converted to sounds at the speaker units 3, $3_1, 3_2, \ldots 3n$.

As described above, since the multi-way speaker system uses the linear-phase FIR type filters 4, $4_1, 4_2, \ldots 4n$, the sound pressure frequency characteristics of the speaker unit generally do not have linear phases although the linear-phase characteristics are held at the channel divider stage, so that the sound pressure characteristics obtained finally may not always be of linear phases. As a result, the waveforms of reproduced sounds are distorted, which makes it difficult to reproduce the sounds with fidelity.

SUMMARY OF THE INVENTION

The present invention has been worked out to solve the above-mentioned problems. With this, the object of the present invention is to obtain such an acoustic system which enables both fidelity-wise transmission and fidelity-wise reproduction of the acoustic signals of each channel. This object is possible by, simultaneously, flattening the amplitude characteristics of the overall transmission frequency response and providing the linear phase-frequency response for each channel.

Any digital channel divider relating to the present invention is provided with means which simultaneously realize the flat amplitude characteristics of the overall transmission frequency response and the linear phase-frequency response for each channel.

The acoustic system which relates to the present invention implements the fidelity-wise transmission and fidelity-wise reproduction of acoustic signals free of waveform distortion, because each channel can enjoy flat amplitude characteristics of the overall transmission frequency response and linear-phase frequency response.

The above and other objects, features, and advantages of the invention will become more apparent from the following description when taken in conjunction with the accompanying drawings.

DESCRIPTION OF THE PREFERRED EMBODIMENT

Figure 1:
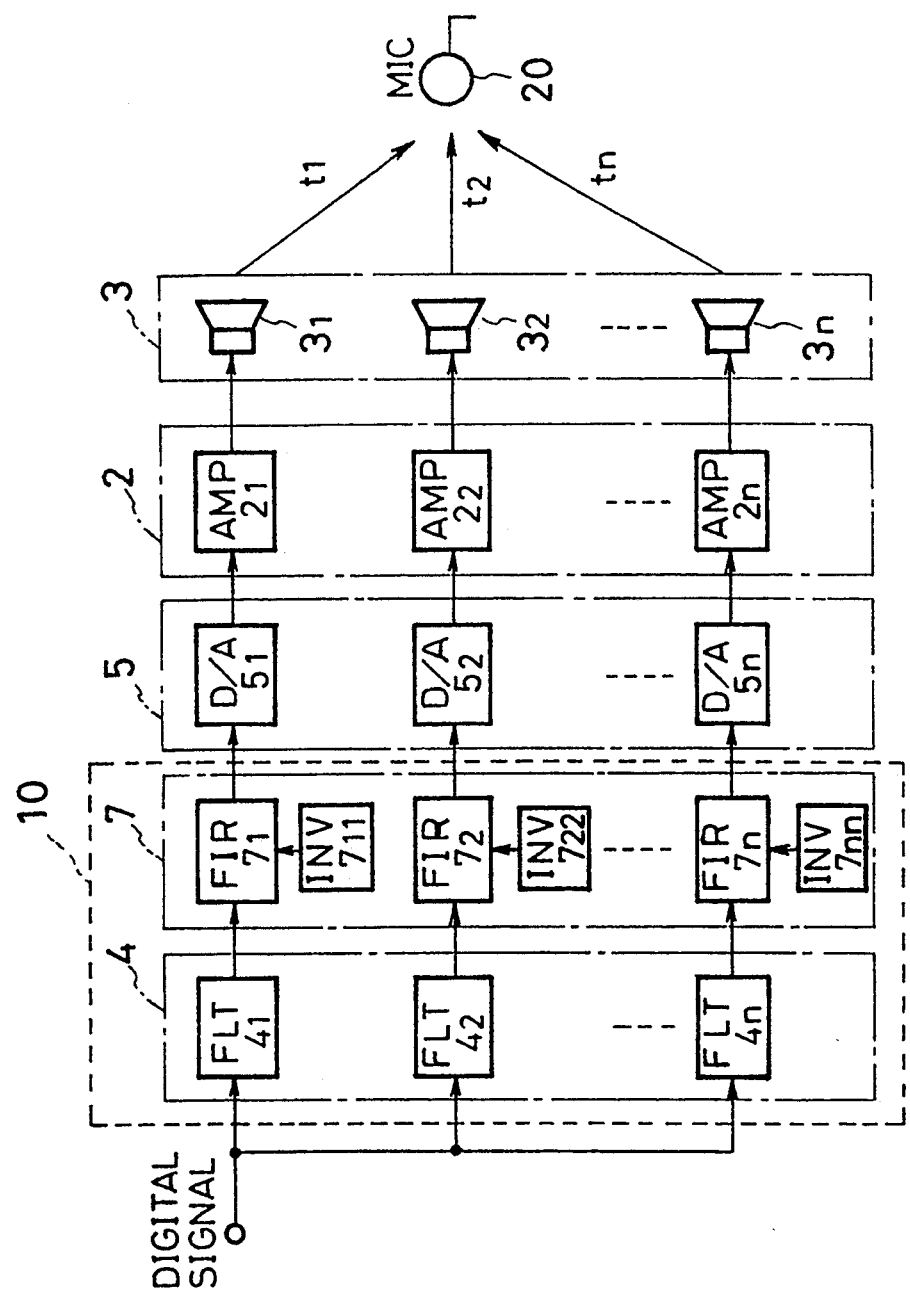
FIGS. 1 through 10 are block diagrams of embodiments of acoustic systems according to the present invention.

FIG. 1 is a block diagram showing an embodiment where an acoustic system of the present invention is used for a multichannel amplifier type speaker system.

In FIG. 1, numerals 2, $2_1$, $2_2$, ... $2n$ represent power amplifiers, numerals 3, $3_1$, $3_2$, ... $3n$ represent speaker units, numeral 10 represents a digital channel divider in the present invention, numerals 4, $4_1$, $4_2$, ... $4n$ represent frequency band dividing circuits as components of the digital channel divider 10, numeral 7 represents a characteristic compensating inverse filter, being a component of the digital channel divider 10, for realizing a flat amplitude characteristic of an overall transmission frequency response of each channel and a linear phase frequency response, numerals 7, $7_1$, $7_2$, ... $7n$ represents a characteristic compensating FIR filter being a component of the characteristic compensating inverse filter 7, numerals $7_{11}, 7_{22}$, ... $7nn$ represent inverse filter factor generating circuits, and numerals 5, $5_1$, $5_2$, ... $5n$ represent D/A converters for converting digital signals into analog signals.

In FIG. 1, a digital input signal is firstly inducted in the frequency band dividing circuit 4. The frequency band dividing circuit 4 divides frequency band into desired frequency bands by means of digital filter such as FIR filter and IIR filter.

An output signal from the frequency band dividing circuit 4 is next inputted in the characteristic compensating inverse filter 7. In the characteristic compensating inverse filter 7, the output signal from the frequency band dividing circuit 4 and the factor data of the inverse filter factor generating circuits $7_{11}, 7_{22}$, ... $7nn$ undergo convolution operations by means of the characteristic compensating FIR filters $7_1, 7_2$, ... $7n$.

Here, The factor data of the inverse filter factor generating circuits $7_{11}, 7_{22}$, ... $7nn$ are set to factor data which give an inverse characteristic of the overall transmission response excepting the characteristic compensating inverse filter 7, in a line from an input of the digital signal until a final arrival at a microphone 20.

In this way, a digital signal compensated previously by the characteristic compensating inverse filter 7 is next converted into an analog signal by the D/A converter circuits 5, $5_1, 5_2$, ... $5n$, and inducted to the speaker units 3, $3_1, 3_2$ ... $3n$ through the power amplifiers 2, $2_1, 2_2$ ... $2n$. At the speaker units 3, $3_1, 3_2$ ... $3n$, convolution operations of the compensated analog signal and an impulse response of the speaker unit is performed. Characteristics obtained finally counterbalance each other making a flat sound pressure and linear phase, thereby realizing fidelity-wise transmission and reproduction of the sound signals.

The order of the frequency band dividing circuit 4 and the characteristic compensating inverse filter 7 in the row can be reversed, in which the operation is the same as the above.

Figure 2:
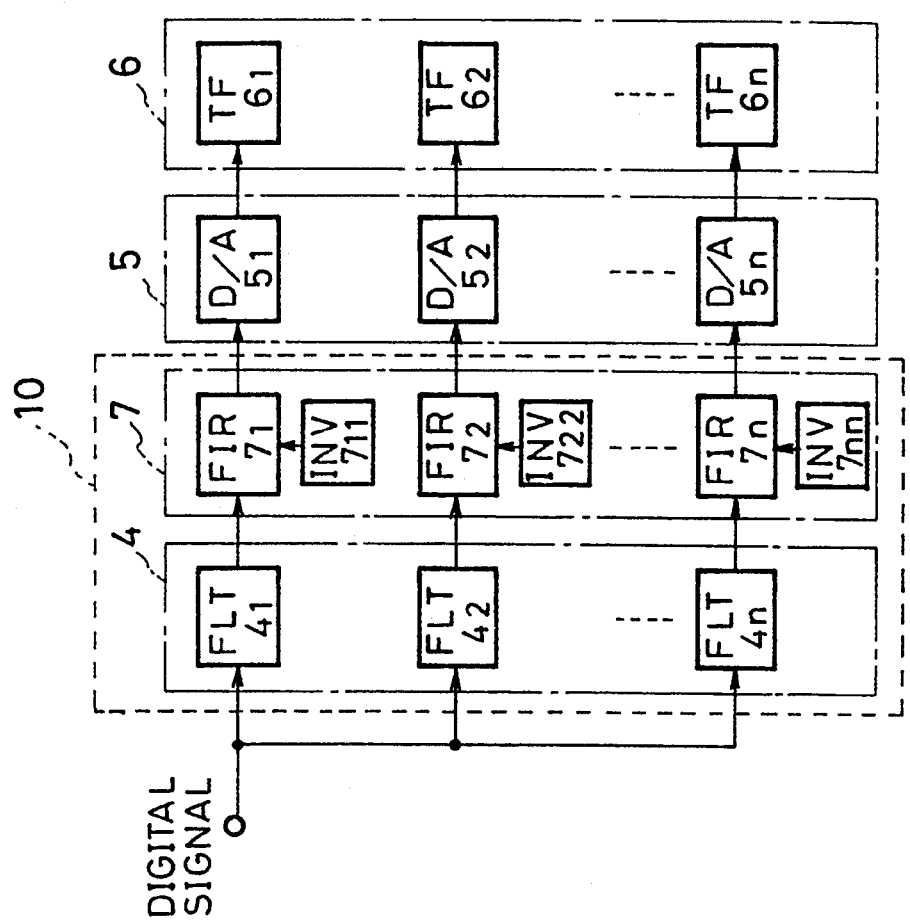

FIG. 2 is a block diagram showing an embodiment in which the acoustic system of the present invention is applied to other general audio system, not restricting to the multi-channel amplifier speaker system. In FIG. 2, numerals 6, $6_2$, ... $6n$ designate audio systems to be connected to the channel divider 10. Here, it is indicated generally by expressing particularly with the transmission response. As for other numerals, they are the same portions as FIG. 1 or corresponding portions thereto, thereby explanation thereof will be omitted.

The operation in FIG. 2 is basically the same as FIG. 1. However, since the audio system 6 is generally connected to the D/A converter circuits 5, $5_1, 5_2$ ... $5n$, the factor data of the inverse filter factor generating circuits $7_{11}, 7_{22}$ ... $7nn$ supply data for giving the inverse characteristic of the overall transmission response excepting the characteristic compensating inverse filter 7 until a digital input signal finally completes the operation of the audio system 6. A characteristic to be obtained finally is that the transmission response of the audio system 6 and the characteristic of the characteristic compensating inverse filter 7 are counterbalanced each other making a flat amplitude and linear phase, thereby realizing fidelity-wise transmission and reproduction of the sound signals.

Needless to say, the digital channel divider of the present invention can be widely applied to devices which operate by dividing the frequency band in the digital signal system or to devices which take out desired frequency bands, other than to said audio systems.

As described above according to the present invention, a flat amplitude characteristic of the overall transmission frequency response of each channel and a linear phase frequency response are realized simultaneously, so that the sound signals can be transmitted and reproduced without distortion.

Figure 3:
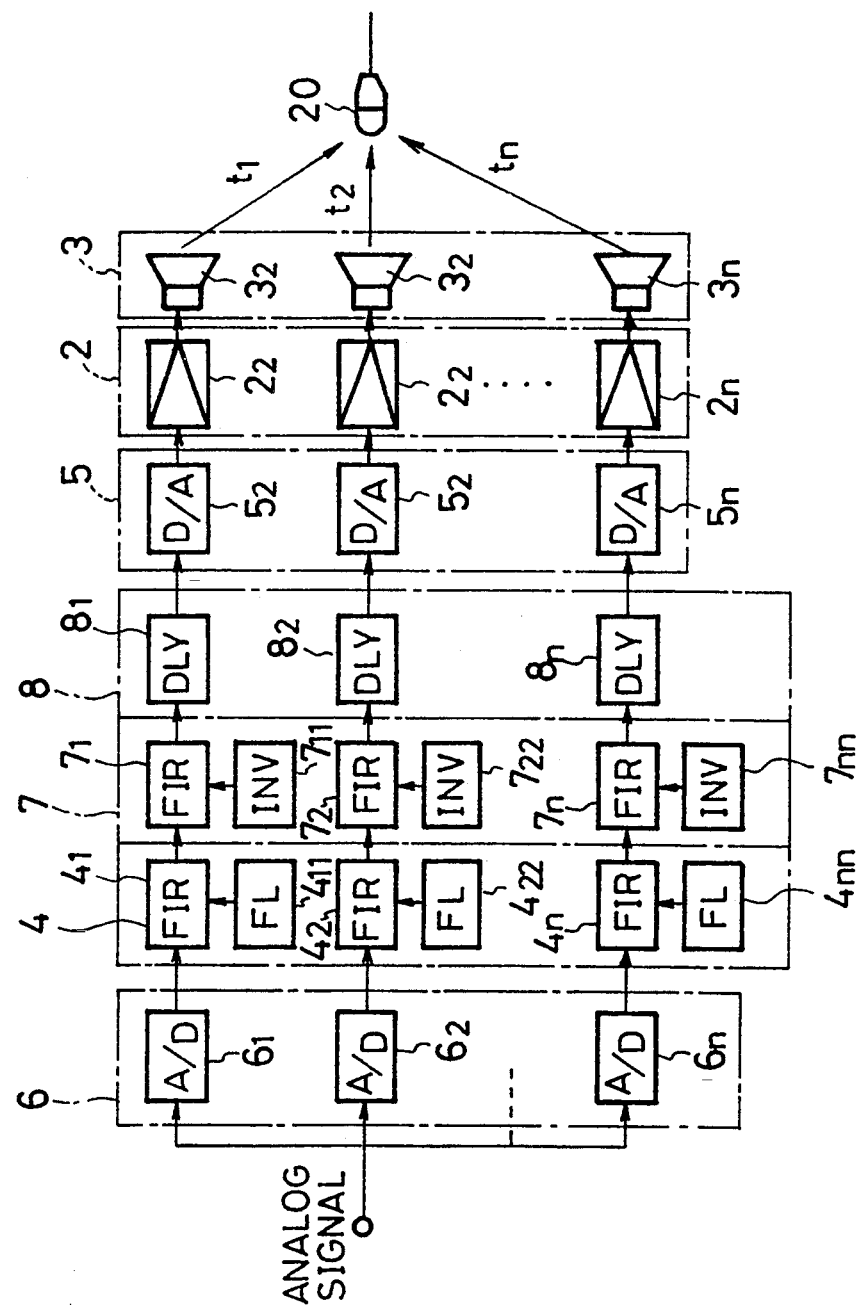

Next, other embodiment of the present invention will be explained. FIG. 3 is a block diagram showing an embodiment of the acoustic system, particularly of the multi-channel amplifier type speaker system according to the present invention. In the Figure, numeral 2 represents power amplifier including a plurality of power amplifiers $2_1, 2_2$, ... $2n$. Numeral 3 designates speaker unit including a plurality of speaker units $3_1, 3_2$ ... $3n$. Numeral 4 represents a band dividing circuit comprising a plurality of linear phase FIR filters $4_1, 4_2$ ... $4n$ and a plurality of filter factor Generating circuits $4_{11}, 4_{22}$ ... $4nn$ for Giving desired frequency dividing characteristics to the linear phase FIR filters. Numeral 5 represents a D/A converter circuit including a plurality of D/A converters $5_1, 5_2$ ... $5n$. Numeral 6 represents an A/D converter circuit including a plurality of A/D converters $6_1, 6_2$ ... $6n$. Numeral 7 represents an inverse filter for flattening the output sound pressure characteristics, consisting of a plurality of FIR type filters $7_1, 7_2$ ... $7n$ and a plurality of inverse filter factor generating circuits $7_{11}, 7_{22}$ ... $7nn$. Numeral 8 represents a delay time compensating circuit including a plurality of delay time compensating circuits $8_1, 8_2$ ... $8n$, and numeral 20 designates a microphone.

In FIG. 3, an analog input signal is converted into a digital signal by the A/D converter circuit 6. In this embodiment, each channel is provided with the A/D converter circuit, and those having same sampling frequency can be used in common. Next, a digital output signal of the A/D converter circuit 6 is inducted into the band dividing circuit 4. In the band dividing circuit 4, by the linear phase FIR filters $4_1, 4_2$ ... $4n$, convolution operations are performed between signals from the filter factor generating circuits $4_{11}, 4_{22}$ ... $4nn$ and the digital output signal in order to obtain a predetermined frequency band dividing characteristic, so as to divide into the desired frequency bands. The digital signal obtained as a result of the convolution operations is further inducted to the inverse filter 7 for flattening output sound pressure characteristic of each speaker unit and, as well as the band dividing circuit 4, the convolution operation is performed between the signals from the inverse filter factor generating circuits $7_{11}, 7_{22}$ ... $7nn$ by the FIR filters $7_1, 7_2$ ... $7n$ so as to compensate the output sound pressure characteristic.

The signal passed through the band dividing circuit 4 and the inverse filter 7, from independent standpoint of each channel, provide a linear phase (constant delay time) and a flat output sound pressure characteristics having the frequency band dividing characteristic by employing the linear phase FIR filter and by adapting the inverse filter. However, the delay time and the phase among the channels do not coincide generally. Therefore, it is necessary that the signal passed through the inverse filter 7 is inducted to the delay time compensating circuits $8_1, 8_2 \ldots 8n$ and the differences of the delay times and the phases among the channels are compensated. The delay times of the delay time compensating circuits $8_1, 8_2 \ldots 8n$ are to be adjusted so that the overall delay time, being added delay times $t_1, t_2 \ldots tn$ caused by the acoustic wave propagation from the speaker units $3_1, 3_2 \ldots 3n$ to the microphone 20, coincides with the overall phase. That is, the delay time differences can be compensated on the basis of one of the delay time compensating circuits $8_1, 8_2 \ldots 8n$.

The digital signal compensated at the delay time compensating circuit 8 is converted into the analog signal at the D/A converter circuits $5_1, 5_2 \ldots 5n$ and inducted to the speaker units $3_1, 3_2 \ldots 3n$ through the amplifiers $2_1, 2_2 \ldots 2n$ for sound radiation. Thus, the problems in the conventional systems such as irregularity of the delay times of radiation sounds, phase deviation, and disorder of the overall output sound pressure characteristic resulted therefrom are solved, so that a multichannel amplifier type speaker system for performing fidelity-wise reproduction of the sounds can be provided.

The A/D converter circuit 6, band dividing circuit 4, inverse filter 7, delay compensating circuit 8, and the D/A converter circuit 5 form a digital signal processing circuit section for controlling the characteristics according to the present invention. This section corresponds to the conventional channel divider for dividing the frequency band. However, the present invention largely differs from the conventional divider in that this section is a circuit which not only divides the frequency band but also compensates the characteristics and delay times. Needless to say, the order in the row of the band dividing circuit 4, inverse filter 7, and delay time compensating circuit 8 can be changed. The delay compensating circuit can be omitted if the delay time is zero second.

Figure 4:
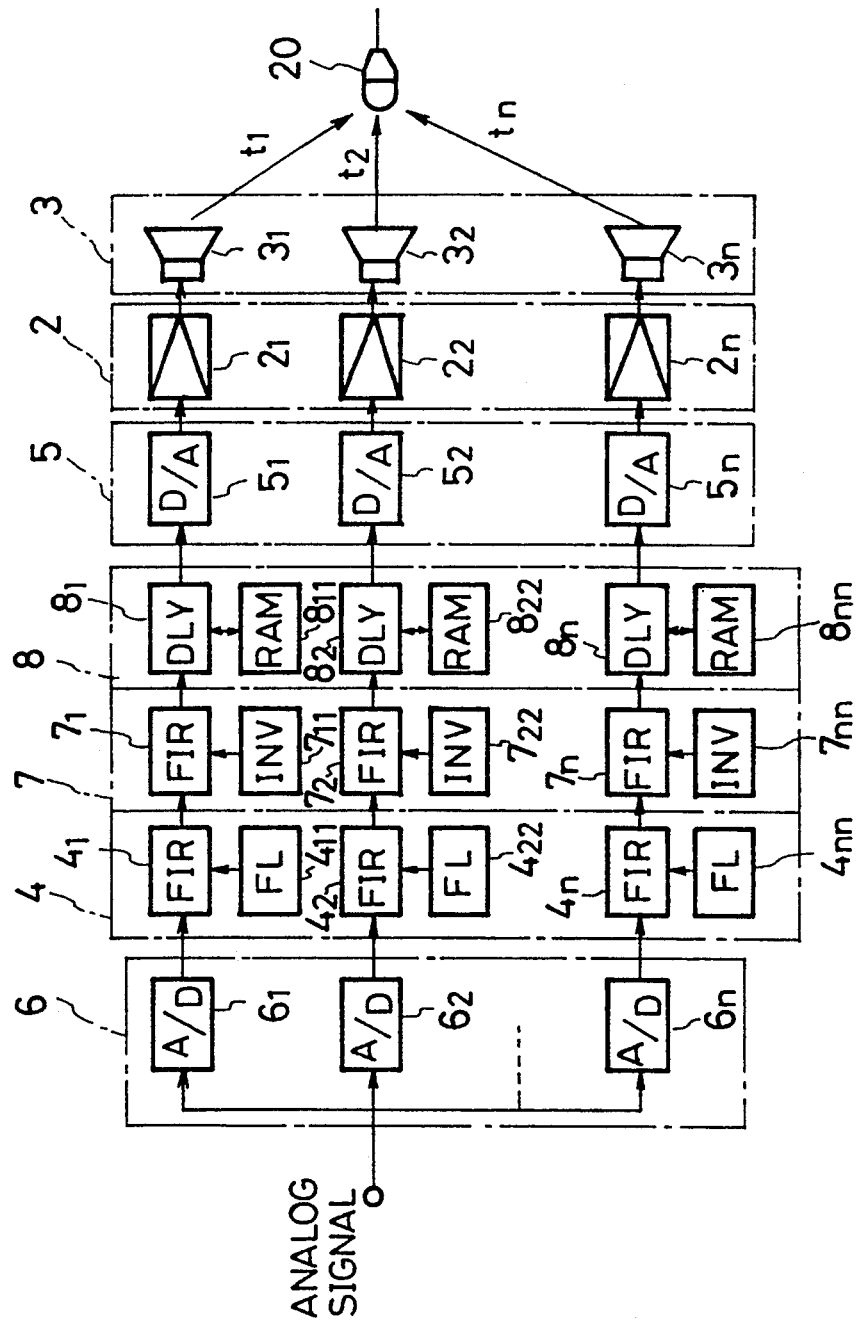
Figure 5:
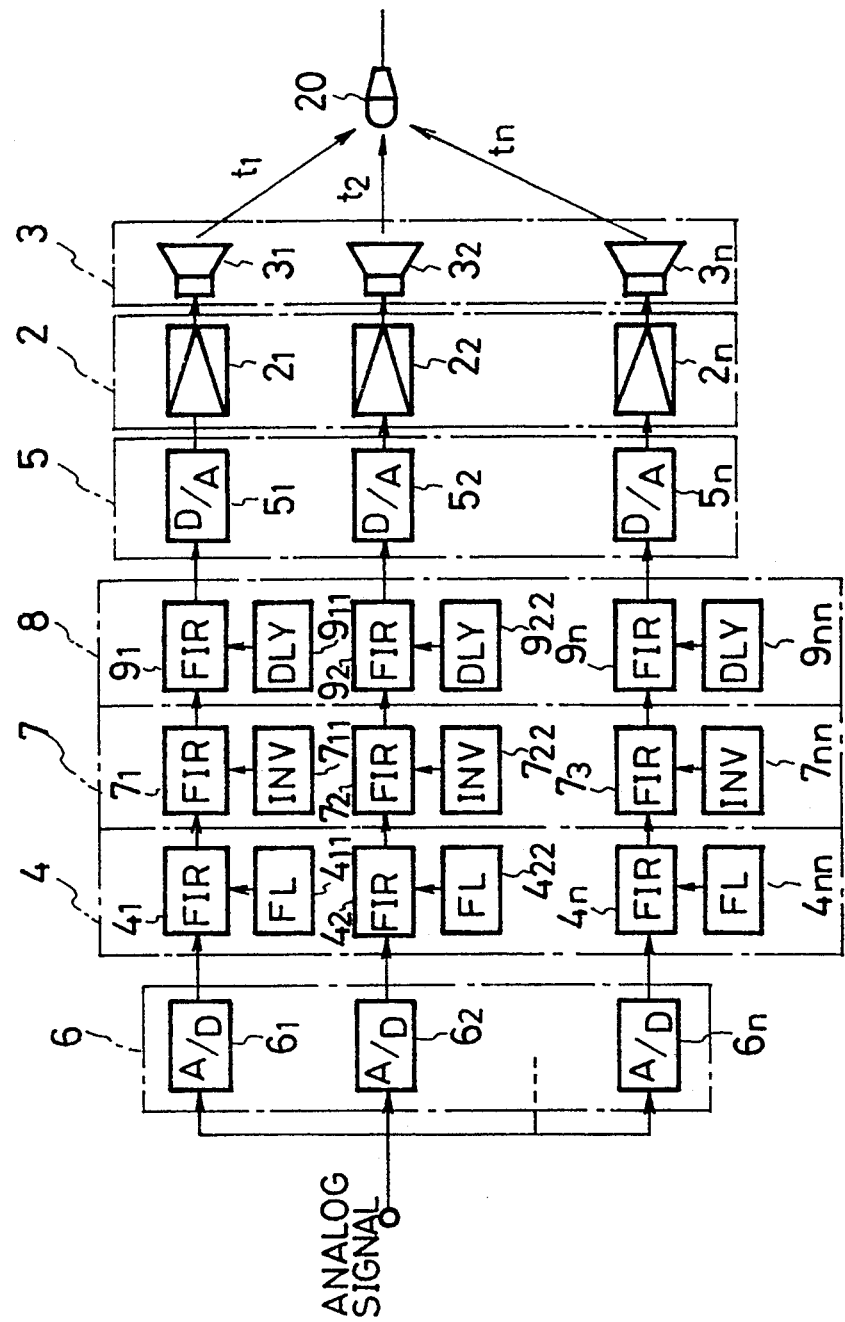

FIGS. 4 and 5 are block diagrams showing other embodiment of the multi-channel amplifier type speaker system in the present invention. In FIGS. 4 and 5, the same reference numbers are marked for the same or corresponding portions of the FIG. 3.

In FIGS. 4 and 5, a different point from FIG. 3 is that the structure of the delay time compensating circuit 8 is explained concretely. In FIG. 4, the delay time compensating circuit 8 is consisted of the delay control circuits $8_1, 8_2 \ldots 8n$ and buffer memories $8_{11}, 8_{22} \ldots 8nn$ for storing signal data temporarily. In FIG. 2, the digital signal led from the inverse filter 7 is stored temporarily in the buffer memories $8_{11}, 8_{22} \ldots 8nn$ by the delay control circuits $8_1, 8_2 \ldots 8n$, and then this data is called after a fixed time. Thus, if the delay control circuit and the buffer memory are employed, the delay time compensating circuit 8 can be miniaturized.

On the other hand, in the embodiment shown in FIG. 5, the delay time compensating circuit 8 is consisted of the linear phase FIR filters $9_1, 9_2 \ldots 9n$ and the delay factor generating circuits $9_{11}, 9_{22} \ldots 9nn$. The digital signal led from the inverse filter 7 undergoes the convolution operation with the signals from the delay factor generating circuits $9_{11}, 9_{22} \ldots 9nn$ by the linear phase FIR filters $9_1, 9_2 \ldots 9n$, and a necessary delay is added thereto. Thus, when the linear phase FIR filter and the delay factor generating circuit are used, the structure becomes same as the band dividing circuit 4 and the inverse filter 7, so that the circuit design will be simplified.

Figure 6:
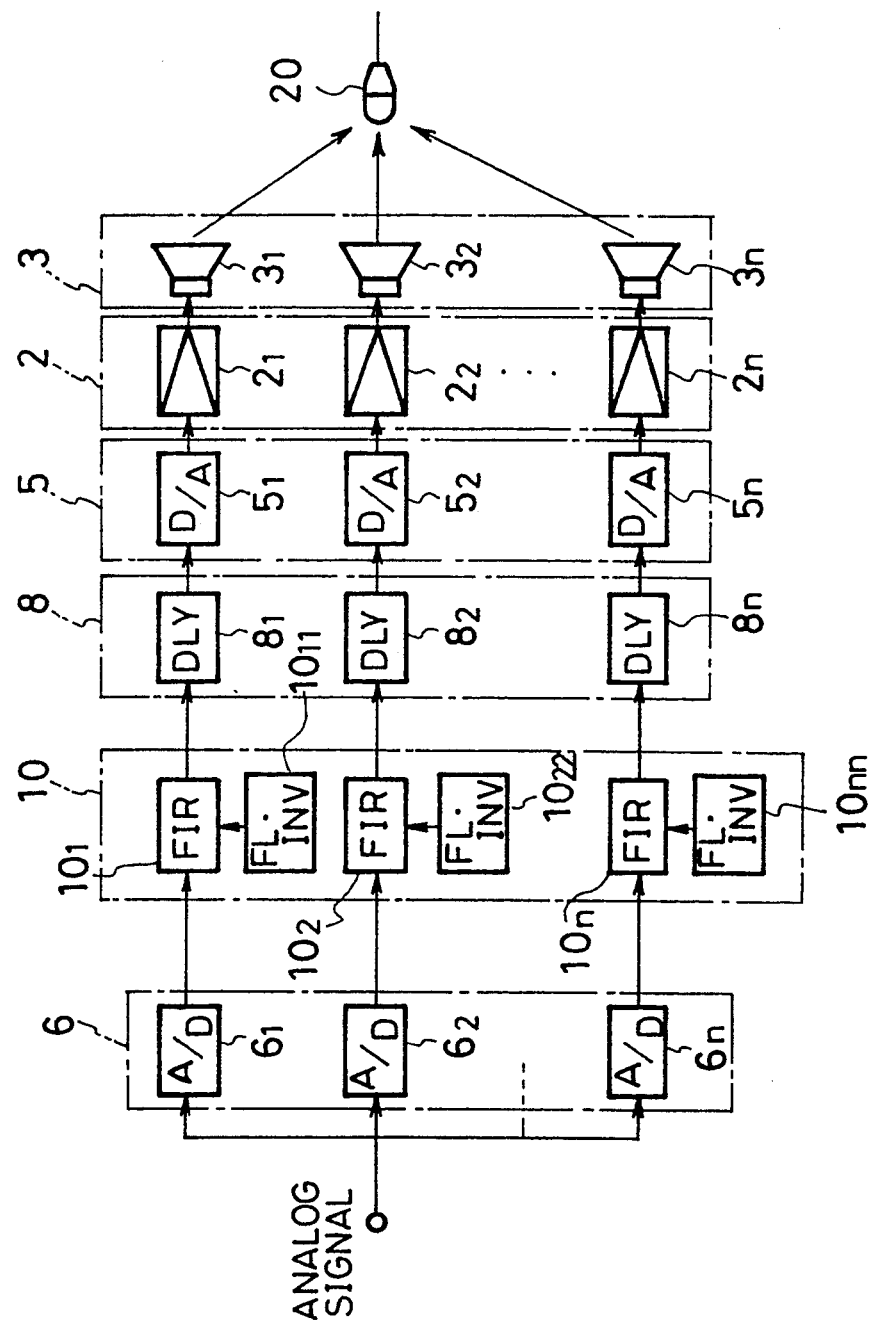

FIG. 6 is a block diagram showing a simplified embodiment of the digital signal processing circuit of the multi-channel amplifier type speaker system according to the present invention. From the embodiment shown in FIG. 3, since it is apparent that the basic circuit structures of the band dividing circuit 4 and the inverse filter 7 are the same, if the factor data of the filter factor generating circuits $4_{11}, 4_{22} \ldots 4nn$ and the factor data of the inverse filter factor generating circuits $7_{11}, 7_{22} \ldots 7nn$ undergo convolution operation, and the resulted factor data (band dividing/inverse filter factor) undergoes the convolution operation with the input signal data from the A/D converter circuit 6, the band dividing circuit 4 can be integrated with the inverse filter 7. The embodiment shown in FIG. 6 is a block diagram where such an integration is performed, which aims simplification of the digital signal processing circuit.

Figure 7:
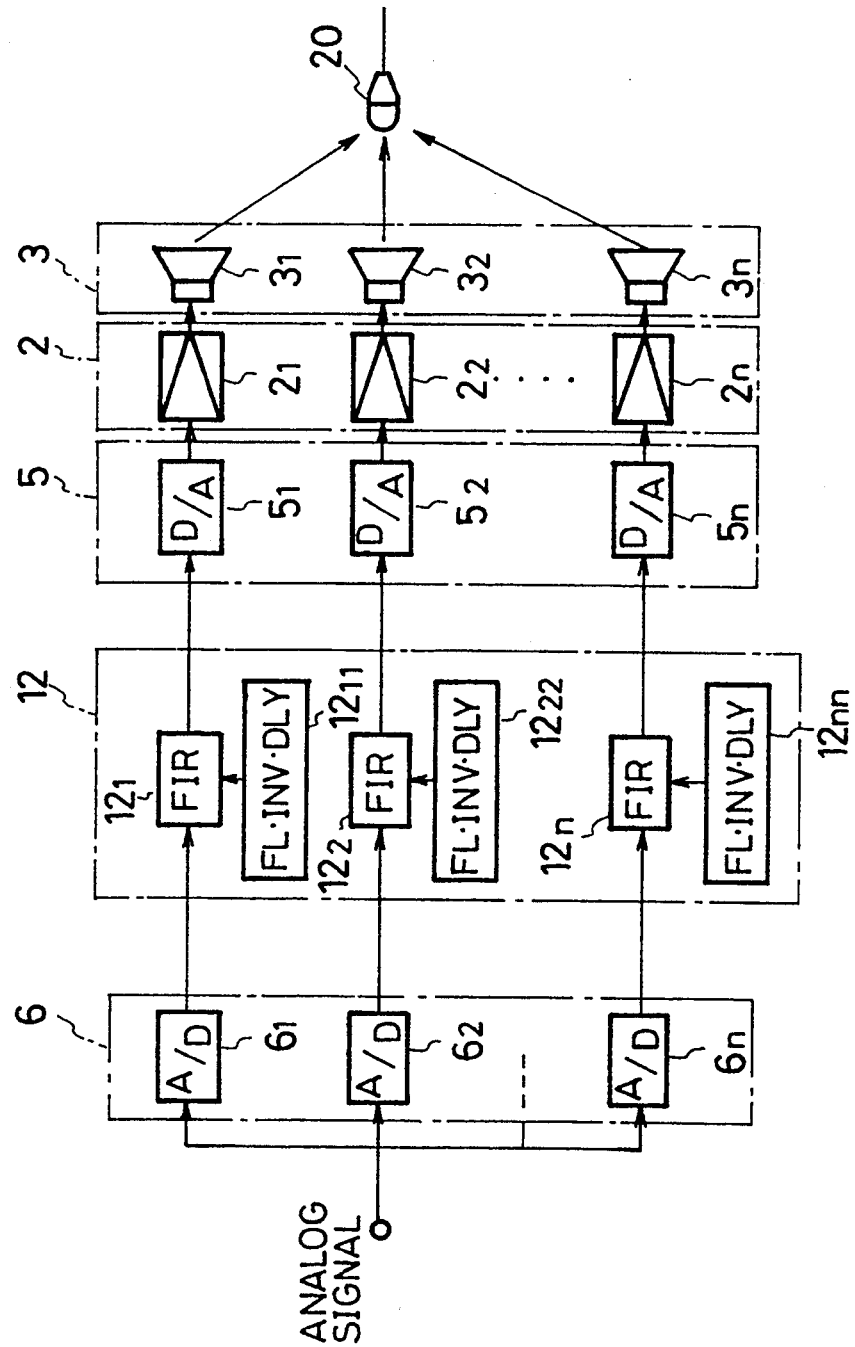

In the same manner, FIG. 7 is a block diagram showing other embodiment of a simplified digital signal processing circuit of the multi-channel amplifier type speaker system according to the present invention. In FIG. 7, factor data of the filter factor generating circuits $4_{11}, 4_{22} \ldots 4nn$, factor data of the inverse filter factor generating circuits $7_{11}, 7_{22} \ldots 7nn$, and factor data of the delay factor generating circuits $9_{11}, 9_{22} \ldots 9nn$ are calculated by convolution operations. The resulted factor data (band dividing/inverse filter/delay compensating factor) is calculated by the convolution operation with the input signal data from the A/D converter circuit 6, so that the band dividing circuit 4, the inverse filter 7 and the delay compensating circuit 8 are to be integrated. In this case, the circuits can be further simpler than the embodiment shown in FIG. 6. As for the delay time compensating circuit 8, as shown in FIG. 4, it is effective only when it is consisted of the linear phase FIR filters $9_1, 9_2 \ldots 9n$ and the delay factor generating circuit $9_{11}, 9_{22} \ldots 9nn$.

Figure 8:
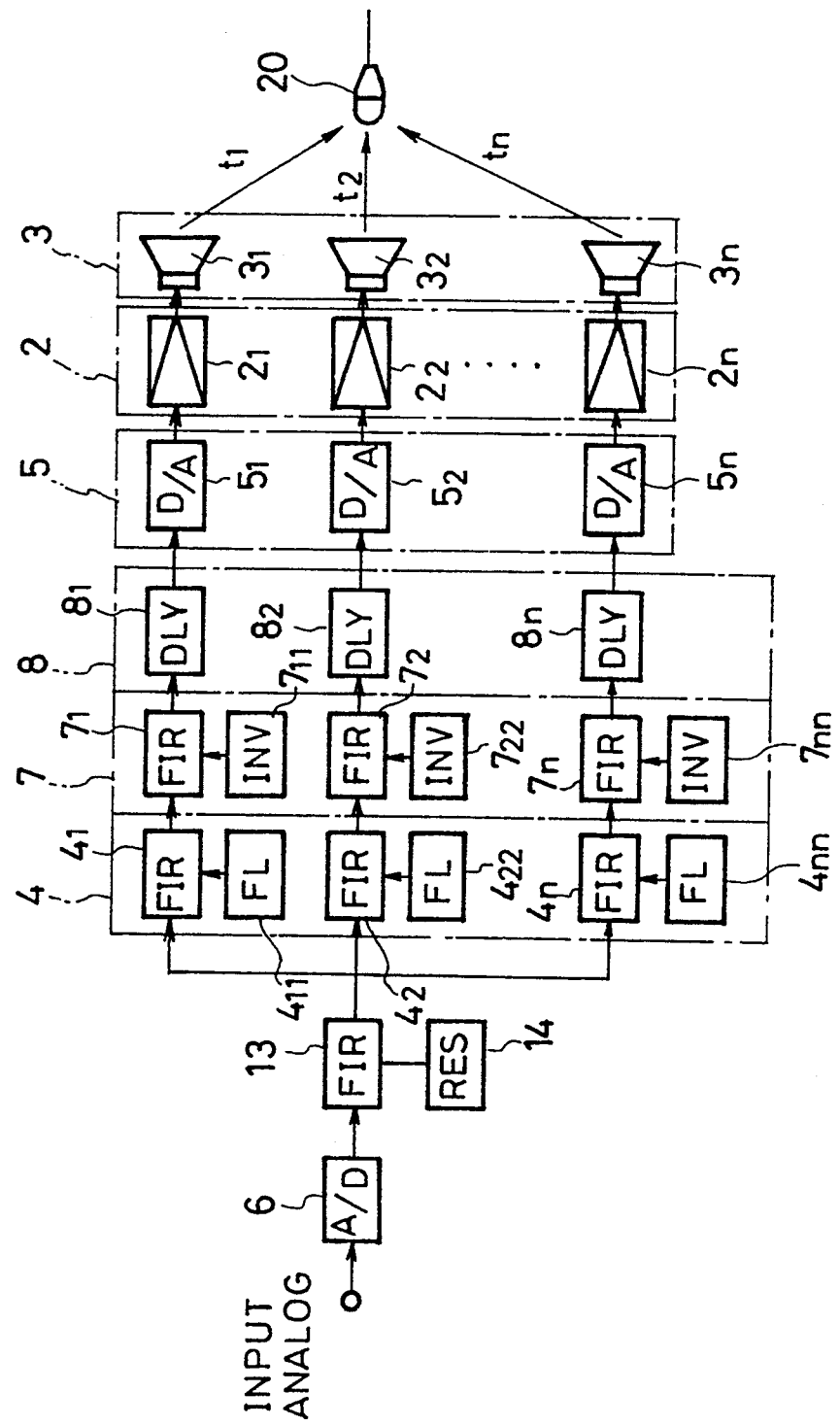

In the multi-channel amplifier type speaker system according to the present invention shown in FIGS. 4 and 7, a flat output sound pressure characteristic and a linear phase (constant delay time) are implemented in relation with the radiation sounds from the speakers. Further, the delay times of the radiation sounds from the speakers $3_1, 3_2 \ldots 3n$ are made to be coincident, so that a multi-channel amplifier type speaker system which provides a highly fidelity-wise sound reproduction can be implemented. When the finally obtained overall output sound pressure characteristic can not be flattened as desired yet due to design error and the like or when the overall output sound pressure characteristic is to be optionally changed, as shown in FIG. 8, an overall sound pressure characteristic compensating linear phase FIR filter 13 and an overall sound pressure characteristic compensating factor generating circuit 14 are provided at the stage prior to the band dividing circuit 4, thereby enabling fine controls of the characteristics. As for the overall sound pressure compensating factor generating circuit 14 shown in FIG. 8, when the overall output sound pressure characteristic is to be flattened, the factor data which give an inverse characteristic of the overall sound pressure characteristic as the overall sound pressure characteristic compensating factor generating circuit 14 may be used. When the characteristic is to be optionally changed, the compensating factor data for compensating the overall sound pressure characteristic is necessary to be calculated and used.

As described above, the multi-channel amplifier type speaker system of the acoustic system according to the present invention uses the digital signal processing circuit for controlling the characteristics instead of the conventional channel dividers for dividing the frequency band. The system of the present invention is further provided with the band dividing circuit for each frequency band, the inverse filter for flattening the output sound pressure characteristic of the speaker, and the delay time compensating circuit for compensating the delay times among the channels, so that the output sound pressure characteristic of the radiation sound from the speaker is compensated, the delay time differences and phase differences are compensated, and the output sound pressure characteristic of the overall radiation sound is flattened. As a result, the present invention has an advantage to implement a speaker system where a high fidelity-wise sound reproduction can be provided without producing the sound pressure distortion.

Figure 9:
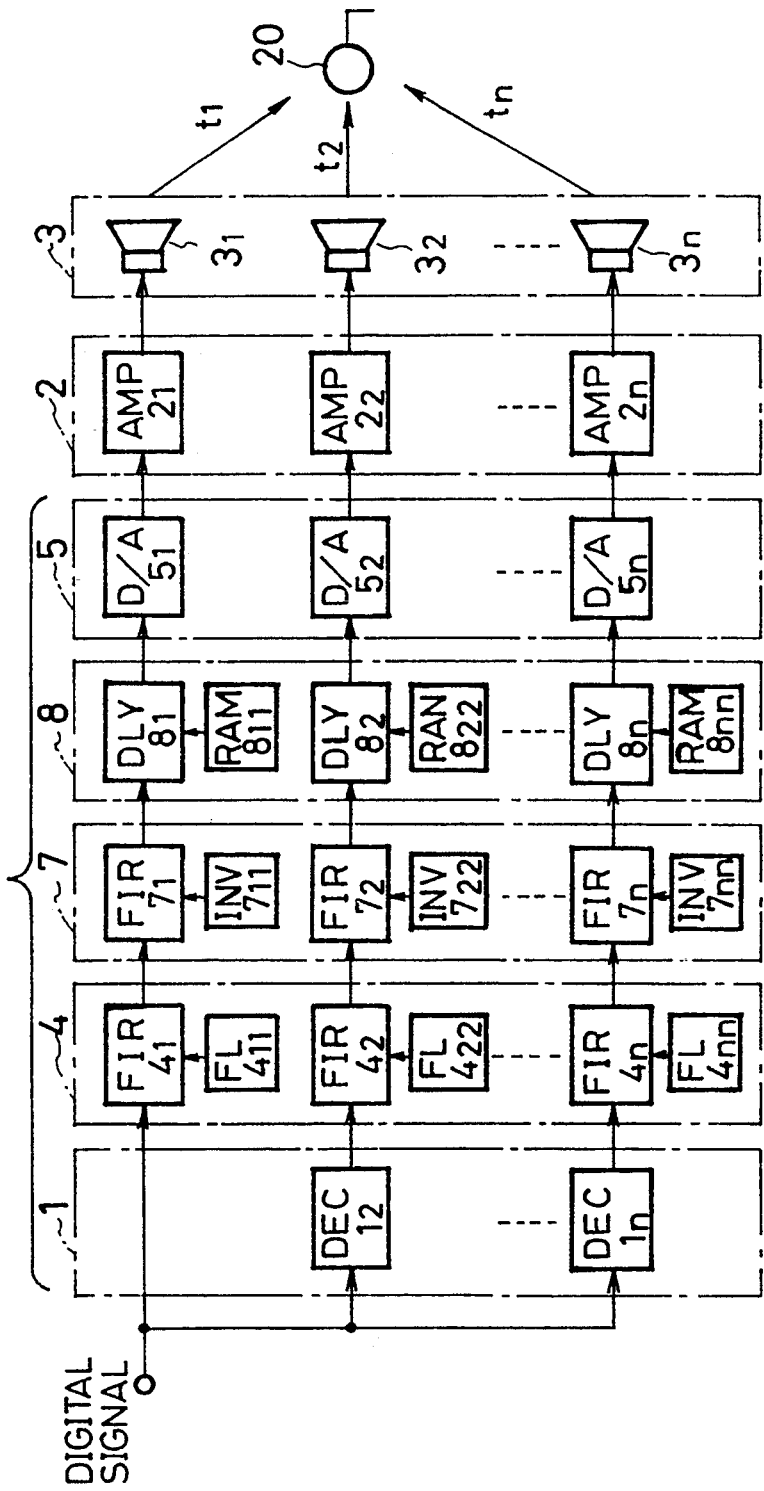

FIG. 9 is a block diagram of other embodiment of the acoustic system of the present invention, particularly of the multi-channel amplifier type speaker system. Referring to FIG. 9, numerals 1, $1_2 \ldots 1n$ designate decimation circuits for reducing the sampling frequency of the digital input signal, numerals 2, $2_1, 2_2 \ldots 2n$ designate power amplifiers, numerals 3, $3_1, 3_2 \ldots 3n$ designate speaker units, numeral 4 represents a frequency band dividing circuit, numerals $4_1, 4_2 \ldots 4n$ represent linear phase type FIR filters as components of the frequency band dividing circuit 4, numerals $4_{11}, 4_{22} \ldots 4nn$ designate frequency band dividing circuit factor generating circuits, numerals 5, $5_1, 5_2 \ldots 5n$ designate D/A converter circuits for converting digital signal into analog signal, numeral 7 represents a characteristic compensating inverse filter for implementing a flat sound pressure characteristic of the speaker unit 7 and a linear phase characteristic, numerals $7_1, 7_2 \ldots 7n$ represent characteristic compensating FIR filters composing the characteristic compensating inverse filter 7, numerals $7_{11}, 7_{22} \ldots 7nn$ represent inverse filter factor generating circuits, numeral 8 designates a delay time compensating circuit, numerals $8_1, 8_2$ delay time compensating circuit 8, numerals $8_{11}, 8_{22} \ldots 8nn$ represent delay time setting memories, and numeral 20 designates a microphone.

Figure 21:
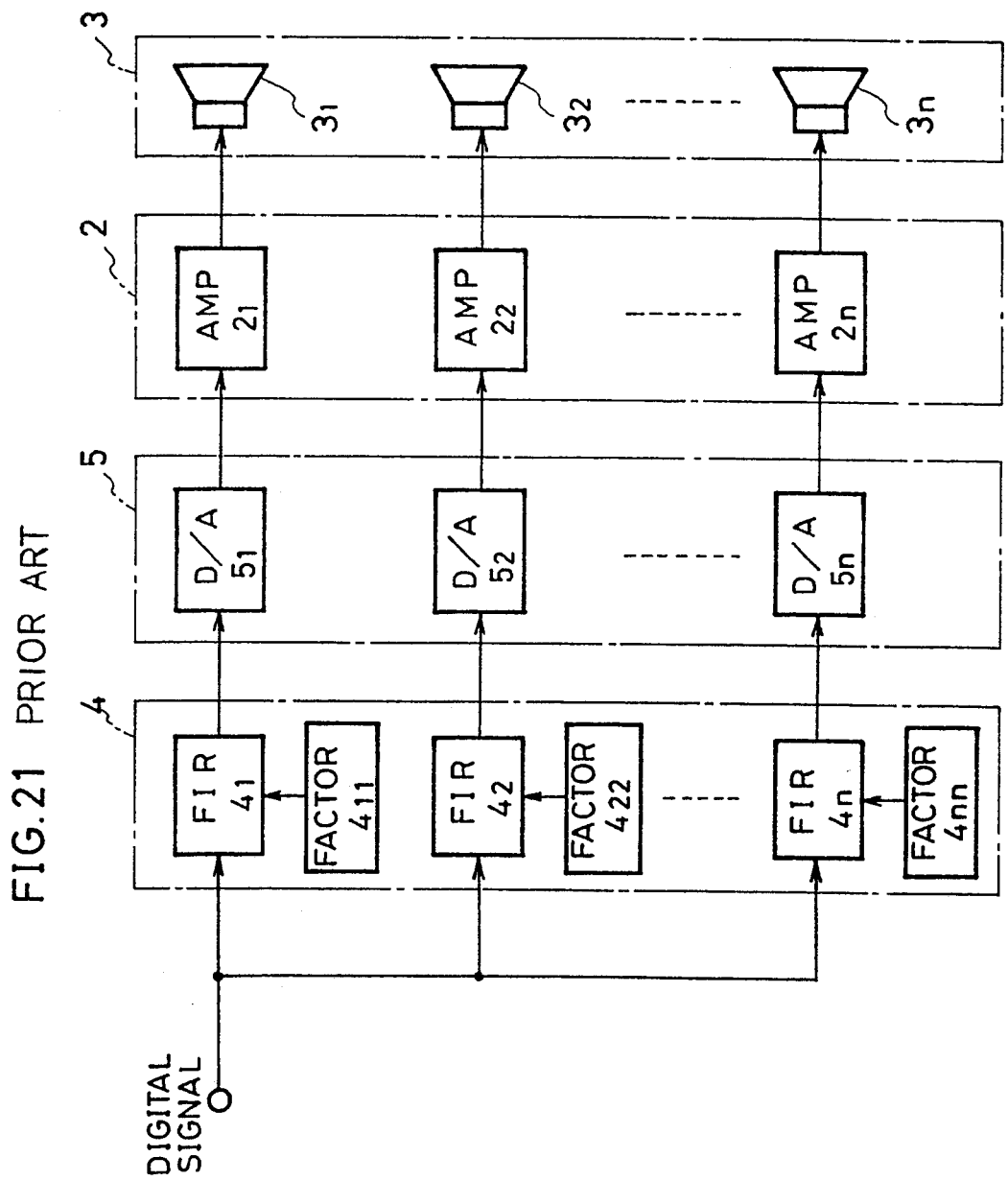
FIG. 21 is a block diagram showing an example of the conventional multi-channel amplifier type digital speaker system.

As for numerals 4, $4_1, 4_2 \ldots 4n$ and $4_{11}, 4_{22} \ldots 4nn$ in FIG. 9, the contents are the same as in FIG. 21 although the expression differs from that of FIG. 21.

In FIG. 9, digital signals are inputted firstly in the decimation circuits 1, $1_2 \ldots 1n$. At this time, the decimation circuit can be omitted in the channel where the signal processing is performed by using the sampling frequency same as the input signal. Generally, input data is thinned out so as to make a lower frequency than a sampling frequency of an input signal. The object of the decimation is to obtain a frequency resolution most effective in the frequency bands pertaining to respective channels.

The output signal of the decimation circuit 1 is next led to the frequency band dividing circuit 4. In the frequency band dividing circuit 4, a convolution operation is performed between a predetermined signal from the frequency band dividing circuit factor generating circuits $4_{11}, 4_{22} \ldots 4nn$ and the above-mentioned digital output signal by means of the linear phase type FIR filters $4_1, 4_2 \ldots 4n$, thereby the frequency band is divided into the desired frequency bands.

The digital signal obtained by the convolution operation is further led to the characteristic compensating inverse filter 7 for flattening the output sound pressure characteristic of the respective speaker units, and as well as the frequency band dividing circuit 4, a convolution operation is performed between the signal from the inverse filter factor generating circuits $7_{11}, 7_{22} \ldots 7nn$ by means of the characteristic compensating FIR filters $7_1, 7_2 \ldots 7n$, thereby compensating the output sound pressure characteristic.

The signal passed through the frequency band dividing circuit 4 and the characteristic compensating inverse filter 7 implements the linear phase (constant delay time) and flat output sound pressure characteristics having the frequency band dividing characteristic at respective channels, by adapting the linear phase type FIR filter and the characteristic compensating inverse filter, being combined with respective speaker units. However, the delay times and phase differences among the channels do not coincide Generally. Therefore, it is necessary that the signal passed through the characteristic compensating inverse filter is next led to the delay time compensating circuit 8 to compensate the delay times and the phase differences among the channels.

In this method, taking the delay times $t_1, t_2 \ldots tn$ due to the sound wave propagation from the speaker units 3, $3_1, 3_2$, the delay processing circuit sections $8_1, 8_2 \ldots 8n$ and the delay time setting memories $8_{11}, 8_{22} \ldots 8nn$ are adjusted so that the overall delay times and the overall phases from the decimation circuit 1 to the microphone 20 coincide among the channels. Concretely, a delay time can be set on the basis of one of the delay processing circuit sections $8_1, 8_2 \ldots 8n$ so as to compensate delay time differences.

The delay time setting memories $8_{11}, 8_{22} \ldots 8nn$ are memory means for storing the inputted digital signals temporarily and the delay processing circuit sections $8_1, 8_2 \ldots 8n$ are calling means for calling stored memories after a fixed time.

The digital signal compensated at the delay time compensating circuit 8 is converted into an analog signal at the D/A converter circuits 5, $5_1, 5_2 \ldots 5n$ and led to the speaker units 3, $3_1, 3_2, \ldots 3n$ through the power amplifiers 2, $2_1, 2_2 \ldots 2n$ so as to perform a sound radiation. Thus, the problems in the conventional systems such as irregularity of the delay times of the radiating sound, phase deviations, resulting disorder of the overall output sound pressure characteristics can be solved, thereby enabling a high fidelity-wise reproduction of the sound.

Needless to say, the D/A converter circuits 5, $5_1, 5_2 \ldots 5n$ comprise lowpass filters for eliminating unnecessary high frequency band components. The order in the row of the frequency band dividing circuit 4, characteristic compensating inverse filter 7, and the delay time compensating circuit 8 may be changed. Further, if the delay time difference among the channels is zero second, the delay time compensating circuit 8 may be eliminated.

Figure 10:
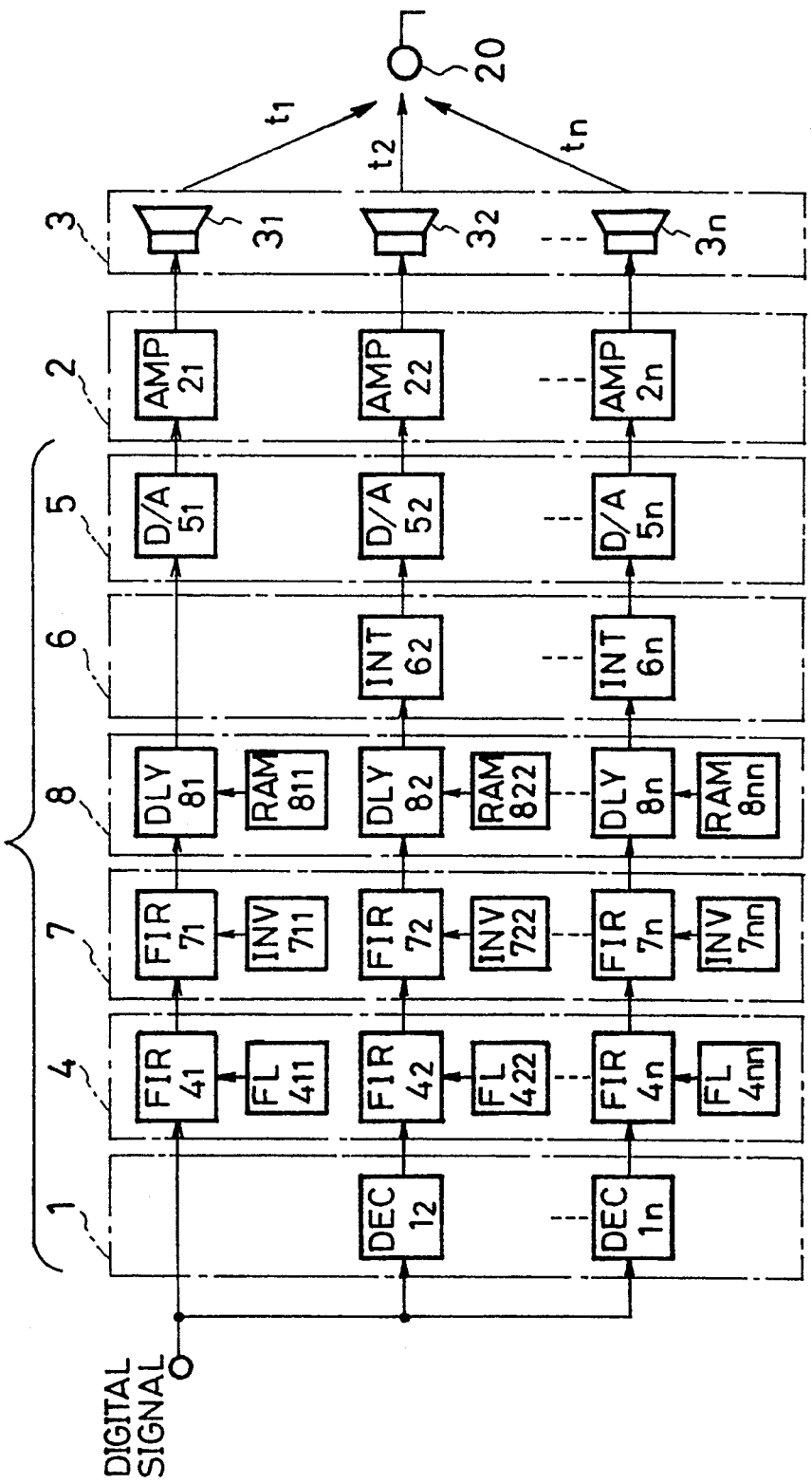

FIG. 10 is a block diagram showing other embodiment of the acoustic system, particularly of the multi-channel amplifier type speaker system according to the present invention. Referring to FIG. 10, numerals 6, $6_2 \ldots 6n$ designate interpolation circuits for turning back sampling frequency to input signal frequency. Descriptions for other reference numbers will be omitted since they are the same parts as FIG. 9 or corresponding to the same.

Referring to FIG. 10, a point different from FIG. 9 is that the interpolation circuits 6, $6_2$ ... 6n are provided. Naturally, the interpolation circuits are not necessary for channels which do not perform the decimation operation.

The operation in FIG. 10 is basically same as FIG. 9. However, by providing the interpolation circuit 6, the sampling frequency can be set identically with input signals. Accordingly, the D/A converter circuits 5, $5_1$, $5_2$ ... 5n can use circuits constructed in the same manner, resulting in simplification of the structure.

Figure 11:
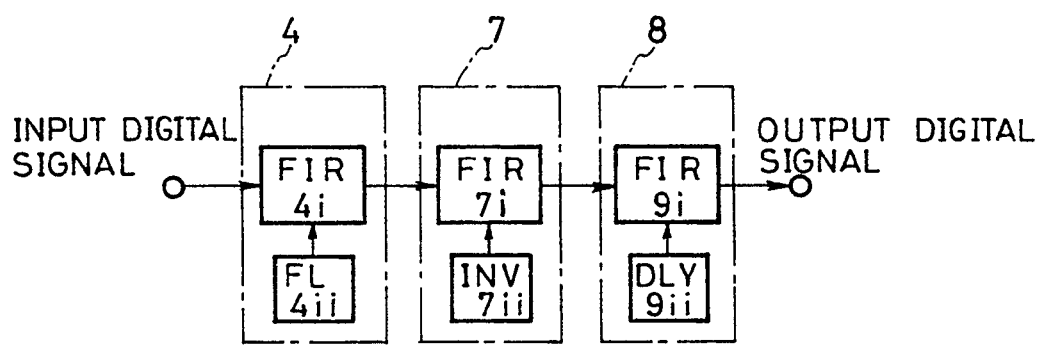
FIG. 11 is a block diagram showing the configuration of the i'th delay time compensating circuit which comprises a frequency-band dividing circuit and characteristics compensating inverse filters.

FIG. 11 is a block diagram showing other embodiment of the delay time compensating circuit 8 used in the acoustic system, particularly in the multi-channel amplifier speaker system, according to the present invention, including i'th frequency band dividing circuit 4 and characteristic compensating inverse filter 7. Here, FIG. 11 is illustrated with i'th component.

The digital signal led from the characteristic compensating FIR filter 7 undergoes convolution operations with the signal from the delay time compensating factor generating circuit $9_{ii}$ by means of delay time compensating linear phase type FIR filter $9_i$, and necessary delay is added. Thus, if the linear phase type FIR filter $9_i$ and the delay time compensating factor generating circuit $9_{ii}$ are used, there is an advantage that the circuit construction will be simplified same as the constructions of the frequency band dividing circuit 4 and the characteristic compensating inverse filter 7.

Figure 12:
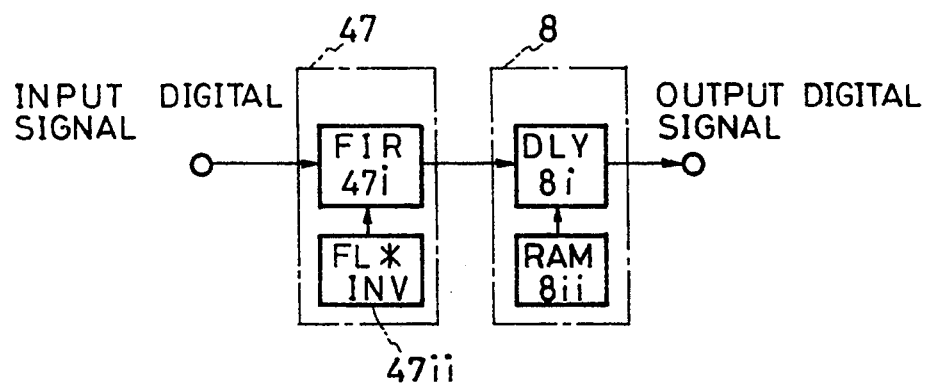
FIG. 12 is a block diagram showing the configuration of the i'th band-dividing/inverse filter circuit in which the frequency-band dividing circuit and the characteristics compensating inverse filter including the delay compensating circuit are simplified.

FIG. 12 is a block diagram showing a simplified embodiment of i'th frequency band dividing circuit 4 and characteristic compensating inverse filter 7 used in the acoustic system, particularly in the multi-channel amplifier speaker system, of the present invention, including the delay time compensating circuit 8. Here, FIG. 12 is illustrated with i'th component.

As shown in FIG. 9, basic circuit structures of the frequency band dividing circuit 4 and the characteristic compensating inverse filter 7 are the same. Accordingly, factor data of the frequency band dividing circuit factor generating circuit $4_{ii}$ and factor data of the inverse filter factor generating circuit $7_{ii}$ are previously calculated by convolution operations. When the factor data (factor for band division/inverse filter) obtained from the convolution operations undergoes convolution operations with the digital input signal, the frequency band dividing circuit 4 and the characteristic compensating inverse filter 7 can be integrated. FIG. 12 is an illustration showing this integration which aims simplification of the circuits.

Figure 13:
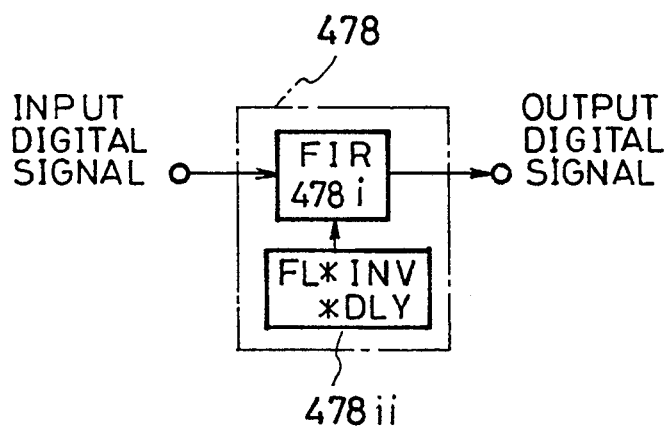
FIG. 13 is a block diagram showing the configuration of a band-dividing/inverse filter/delay time compensating circuit in which the i'th frequency-band dividing circuit, characteristics compensating inverse filter, and delay compensating circuit are simplified.

FIG. 13 is a block diagram showing a simplified embodiment of i'th frequency band dividing circuit 4, characteristic compensating inverse filter 7, and the delay time compensating circuit 8 used in the acoustic system, particularly in the multichannel amplifier speaker system, according to the present invention. Here, FIG. 13 illustrates i'th component.

As shown by the block diagram in FIG. 11, the configuration of the delay time compensating circuit 8 is the same as the circuit configurations of the frequency band dividing circuit 4 and the characteristic compensating inverse filter 7. Accordingly, the factor data of the frequency band dividing circuit factor generating circuit $4_{11}$, factor data of the inverse filter factor generating circuit $7_{ii}$, and the factor data of the delay time compensating factor generating circuit $9_{ii}$ are previously calculated by convolution operations. When the factor data (factors for band dividing/inverse filter/delay time compensation) obtained from the above convolution operations undergoes convolution operations with the digital input signal, the frequency band dividing circuit 4, characteristic compensating inverse filter 7 and the delay time compensating circuit 8 can be integrated. FIG. 13 is a block diagram showing such an integration, which aims simplification of the circuits.

Figure 14:
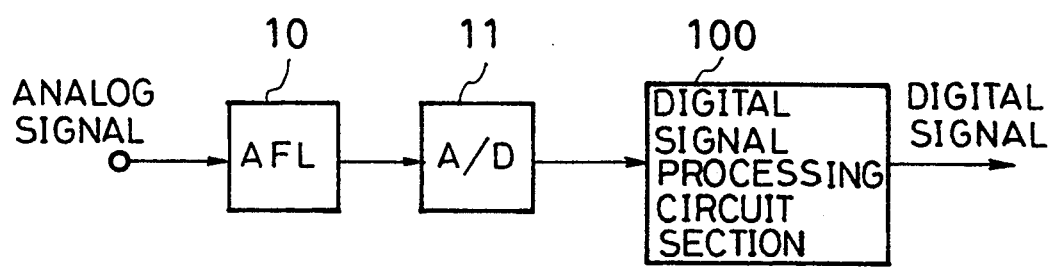
FIG. 14 is a block diagram showing the configuration of the section where analog signals are converted into digital signals.

In the acoustic system according to the present invention as shown in FIGS. 9 through 13, it is assumed that digital signals are to be inputted. Accordingly, it can not be used basically for inputting analog signals. FIG. 14 is a block diagram showing an embodiment of a multichannel amplifier type speaker system of the present invention which can be used also for inputting analog signals. In FIG. 14, those Parts shown in FIGS. 9 through 13 are omitted.

Referring to FIG. 14, reference number 10 represents an anti-aliasing filter and 11 represents an A/D converter circuit. The anti-aliasing filter 10 eliminates unnecessary high frequency band components and the analog signal is converted into digital signal at the A/D converter circuit 11. This digital output signal is used as an input signal in FIGS. 9 through 13 so that it will be possible to use also for the analog signal input.

As described above, in the acoustic system according to the present invention shown in FIGS. 9 through 14, a flat output sound pressure characteristic and linear phase (constant delay time) relating to the radiation sounds from the speakers can be realized, and further, the delay times of the radiation sounds from the speaker units $3_1$, $3_2$ ... 3n are made to be coincident, so that a high fidelity-wise reproduction of the sounds can be implemented. However, when a finally obtained overall output sound pressure characteristic can not be flattened yet as required due to design error and the like or when the overall output sound pressure characteristic is to be controlled to an optional characteristic, the overall characteristic can be compensated at the stage before the digital signal input in FIGS. 9 through 13 or at the stage after the A/D converter circuit 11 in FIG. 14.

Figure 15:
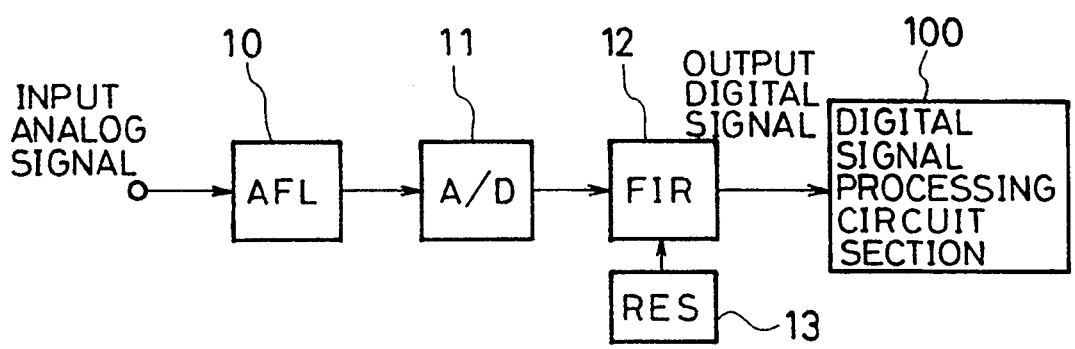
FIG. 15 is a block diagram showing the configuration of the overall output sound pressure characteristics compensating section.

FIG. 15 is a block diagram showing an embodiment of a multichannel amplifier type speaker system according to the present invention, in which compensation of said overall characteristic is also possible. In FIG. 15, however, the those parts shown in FIGS. 9 through 13 are eliminated as well as FIG. 14.

Referring to FIG. 15, reference number 12 represents an overall characteristic compensating linear phase type FIR filter and number 13 designates an overall characteristic compensating factor generating circuit. Other reference numbers are same as in FIG. 14.

In FIG. 15, when the finally obtained overall output sound pressure characteristic is to be more flattened, factor data which give inverse characteristic of previously obtained overall sound pressure characteristic as factor data of the overall characteristic compensating factor generating circuit 13 may be used. When the characteristic is to be controlled optionally, compensating factor data for obtaining a desired overall sound pressure characteristic should be previously calculated to use. Those factor data and the digital signal output of the A/D converter circuit 11 are convoluted by the overall characteristic compensating linear phase type FIR filter 12 and delivered as a digital signal input in FIGS. 9 through 13, thereby realizing a flat overall output sound pressure characteristic or a control to an optional characteristic.

Although an analog signal input is shown in FIG. 15, the anti-aliasing filter 10 and the A/D converter circuit 11 are unnecessary in case of digital signal input.

Figure 16:
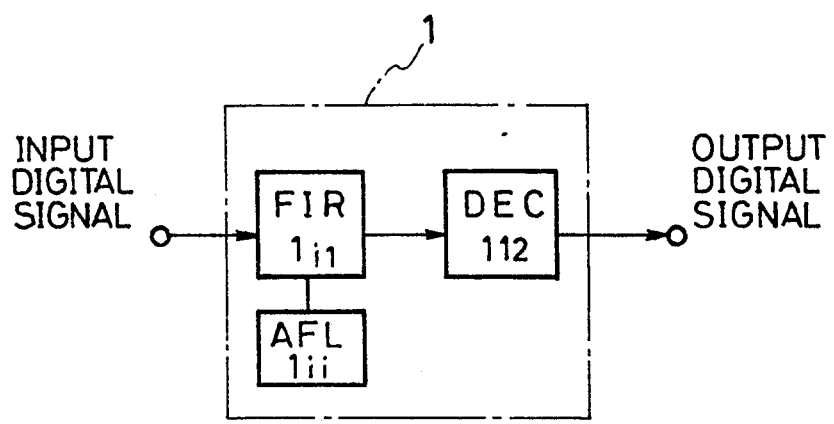
FIG. 16 is a concrete configuration of the i'th decimation circuit.

FIG. 16 is a block diagram showing a concrete configuration of i'th decimation circuit used in the acoustic system according to the present invention, which uses i'th component.

Referring to FIG. 16, reference number $1_{ii}$ designates a FIR type anti-aliasing filter for decimation, number $1_{ii}$ represents a decimation filter factor generating circuit, and reference number $1_{i2}$ designates a decimation processing section for thinning out digital data.

Referring to FIG. 16, a digital signal input undergoes convolution operations with the factor data of the factor generating circuit $1_{ii}$ by means of the FIR type anti-aliasing filter $1_{ii}$, and unnecessary high frequency band components are eliminated at i'th channel. Accordingly, the decimation processing section $1_{i2}$ implements a thinning out processing of the digital data without loop back distortions.

As described above, in the acoustic system of the present invention, the digital signal processing circuit section for controlling characteristics is provided instead of conventional channel divider for dividing a frequency band. The digital signal processing section is provided with the decimation circuit for reducing the sampling frequency for each channel, band dividing circuit consisted of the linear phase FIR filter, FIR type inverse filter for flattening the output sound pressure characteristic of the speaker, delay time compensating circuit for compensating the delay times among the channels, interpolation circuit for turning back sampling frequency to input signal frequency, and the. D/A converter circuit for converting digital signal into analog signal, and further, the overall characteristic compensating linear phase type FIR filter, so that the output sound pressure characteristic of the radiation sounds, delay time differences and phase differences are compensated, and further, the output sound pressure characteristic of the overall radiation sounds are flattened and the characteristics are controlled. Thus, the present invention has advantages to realize a speaker system in which a high fidelity-wise reproduction of the sounds is possible without sound pressure distortions.

Figure 17:
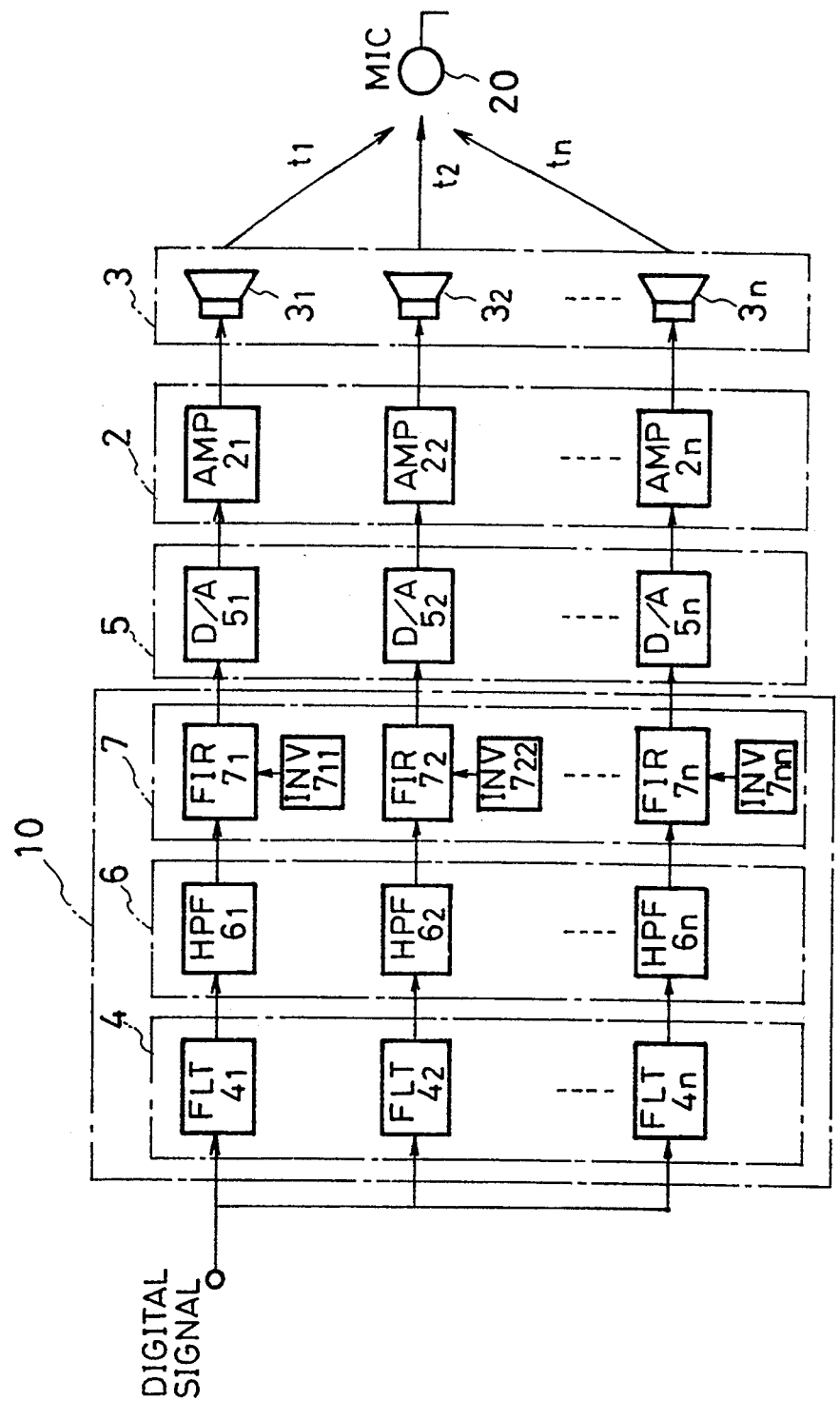
FIG. 17 is a block diagram showing an embodiment according to the present invention.

FIG. 17 is a block diagram showing other embodiment of the acoustic system according to the present invention. Referring to FIG. 17, reference numbers 2, $2_1$, $2_2$ ... 2n represent power amplifiers, reference numbers 3, $3_1$, $3_2$ ... 3n represent speaker units, reference number 20 designates a digital channel divider according to the present invention, reference numbers 4, $4_1$, $4_2$ ... 4n represent a frequency band dividing circuit which constructs the digital channel divider 10, reference numbers 6, $6_1$, $6_2$ ... 6n represent digital high pass filters for restricting inputting to the speaker units 3, $3_1$, $3_2$ ... 3n at a low frequency area, and number 7 represents a component of the digital channel divider 10 and also a characteristic compensating inverse filter for flattening the amplitude characteristic of the overall transmission frequency response of the channels and for realizing a linear phase frequency characteristic, reference numbers $7_1$, $7_2$, ... 7n represent characteristic compensating FIR filters being a component of the characteristic compensating inverse filter 7, reference numbers $7_{11}$, $7_{22}$ ... 7nn represent inverse filter factor generating circuits, reference numbers 5, $5_1$, $5_2$ ... 5n represent D/A converter circuits for converting digital signals into analog signals, and reference number 20 designates a sound pressure frequency characteristic measuring microphone.

Referring to FIG. 17, the operation will be described hereinafter. Digital input signal is first led to the frequency band dividing circuit 4. In the frequency band dividing circuit 4, frequency band is divided into a desired frequency bands by means of digital filters such as FIR filter and IIR filter.

The output signal from the frequency band dividing circuit 4 is next inputted in the digital high pass filter 6 and the input level is reduced at a frequency below the lowest resonance frequency of the speaker unit. The reason for using the digital high pass filter 6 will be described later.

The digital output signal which is restricted, by the digital high pass filter 6, to be inputted at a frequency below the lowest resonance frequency is next inputted in the characteristic compensating inverse filter 7. At the characteristic compensating inverse filter 7, the output signal from the digital high pass filter 6 and the factor data of the factor generating circuits $7_{11}$, $2_{27}$ ... 7nn which give inverse characteristic of the sound pressure frequency characteristic of the speaker unit undergo real time convolution operations by means of compensating FIR filters $7_1$, $7_2$ ... 7n, thereby generating a digital signal whose characteristic is compensated.

Thus, the digital signal whose characteristic has been previously compensated by the characteristic compensating inverse filter 7 is further converted into analog signal at the D/A converter circuits 5, $5_1$, $5_2$ ... 5n, and is led to the speaker units 3, $3_1$, $3_2$ ... 3n through the power amplifiers 2, $2_1$, $2_2$ ... 2n. At the speaker units 3, $3_1$, $3_2$ ... 3n, the compensated analog signal and an impulse response of the speaker unit sound pressure undergo convolution operations, so that the sound pressure frequency characteristic is flattened and a linear phase frequency characteristic can be obtained finally.

Referring to FIG. 17, as for the factor data of the inverse filter factor generating circuits $7_{11}$, $7_{22}$ ... 7nn, in relation with factor data which gives inverse characteristic of the sound pressure frequency characteristic of the speaker units 3, $3_1$, $3_2$ ... 3n or the line which starts from inputting of the digital signal and ends by reaching finally the microphone 20 (including the sound wave propagation times $t_1$, $t_2$ ... tn from speaker units 3, $3_1$, $3_2$ ... 3n to the microphone 20), factor data which give inverse characteristic of the overall transmission frequency response excepting the digital high pass filter 6 and the characteristic compensating inverse filter 7 is to be set.

The reason of the above is that the frequency characteristic of the compensated analog signal and the sound pressure frequency of the speaker unit are compensated each other, so that flat sound pressure and linear phase are provided at least at the frequency above the lowest resonance frequency of the speaker unit and fidelity-wise transmission and reproduction of the sound signals are provided.

Figure 18:
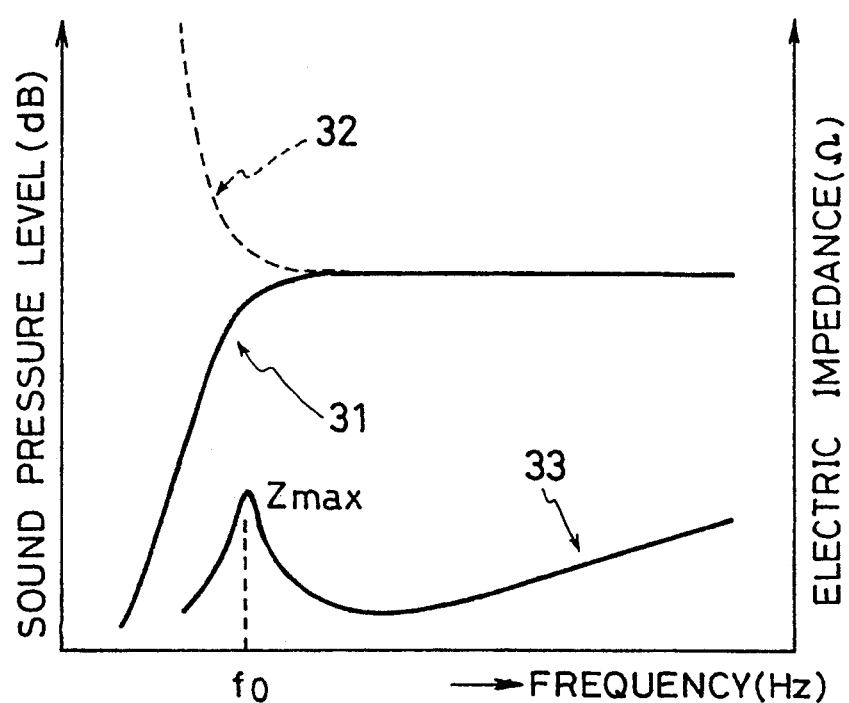
FIG. 18 is a characteristic curve showing the sound pressure frequency response and the electrical impedance characteristics of the electrical acoustic-wise property of general speaker, units.

FIG. 18 shows electric sound characteristic of a general speaker unit in relation with a sound pressure frequency characteristic 31 and an electric impedance 33. As shown in FIG. 18, the sound pressure level of the sound pressure frequency characteristic 31 generally decreases in the low frequency domain. Accordingly, as for the frequency characteristic 32 of the characteristic compensating inverse filter 7, the sound level pressure will be necessarily a raised sound pressure of the low frequency domain. As a result, if the characteristic compensating inverse filter 7 is provided, the input voltage to the speaker unit increases rapidly at the low frequency domain, resulting in damage of the speaker unit.

The object of the use of the digital high pass filter 6 is to restrict an excessive input to the speaker unit at the low frequency domain such as mentioned above. The input level of the low frequency domain decreases rapidly particularly when a cutoff frequency of the digital high pass filter 6 is set to a resonance frequency approximating to the lowest resonance frequency of the speaker unit, so that the excessive input to the speaker unit can be restrained effectively.

As described above, by providing the digital high pass filter 6 and the characteristic compensating inverse filter 7 as components of the digital channel divider 10, a fidelity-wise reproduction of the sound signals and prevention of the excessive input can be realized simultaneously.

Needless to say, the above-mentioned operation is the same even if the order in the row of the frequency band dividing circuit 4 and the characteristic compensating inverse filter 7 is changed.

Figure 19:
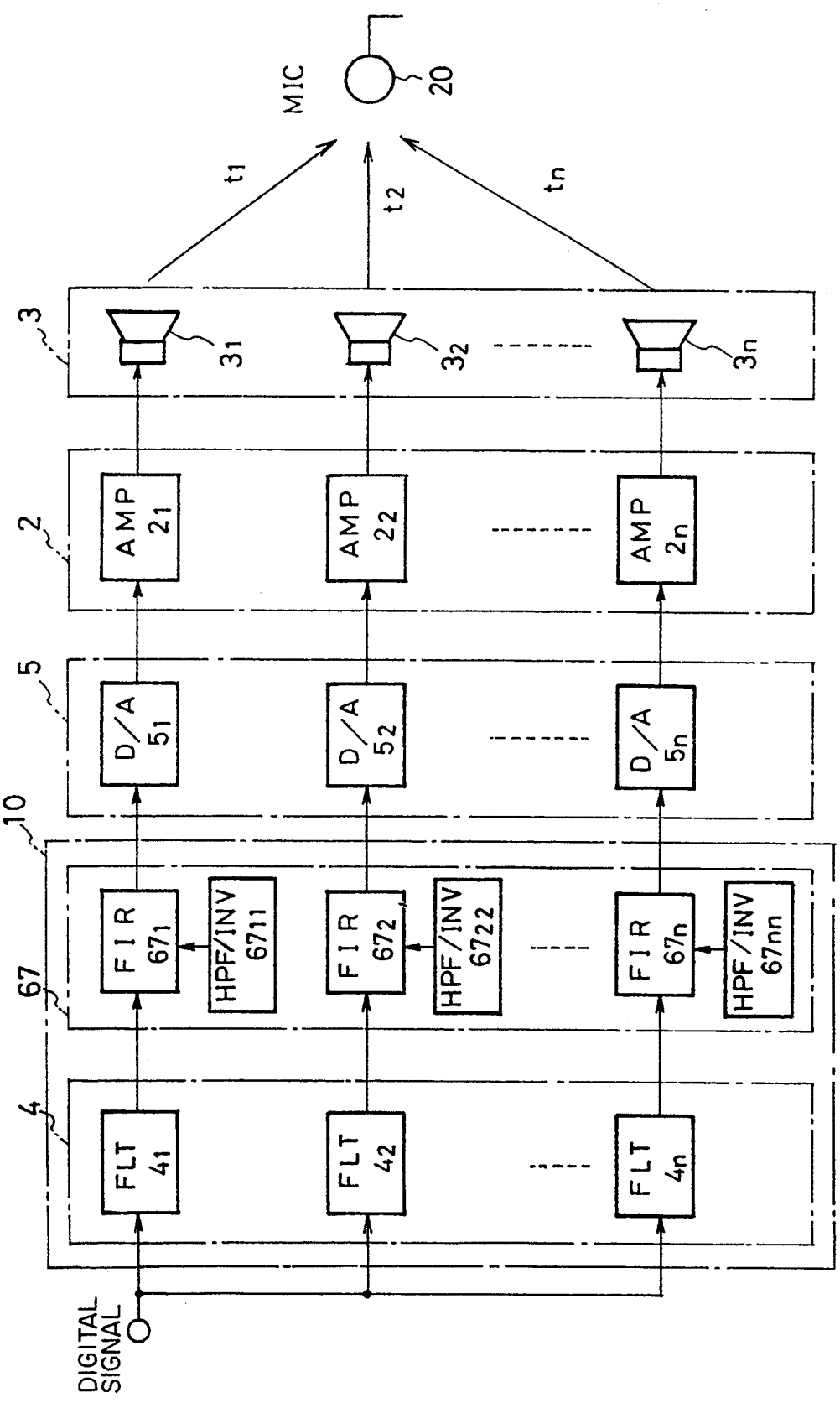
FIG. 19 is a block diagram showing another embodiment according to the present invention.

FIG. 19 is a block diagram showing other embodiment of the acoustic system of the present invention, in which the digital channel divider is used in the multichannel amplifier type speaker system.

Referring to FIG. 19, the basic operation is the same as FIG. 17, and the fidelity-wise reproduction of the sound signals and the prevention of the excessive input can be realized simultaneously by the same reason.

A point different from FIG. 18 is that a high pass/characteristic compensating filter 67, which is an integration of the digital high pass filter 6 and the characteristic compensating inverse filter 7, is provided.

Here, meaning of the integration is as follows. That is, the digital high pass filter 6 is realized by the FIR type filter. The filter factor data thereof and the factor data of the factor generating circuits $7_{11}, 7_{22} \ldots 7nn$ which give inverse characteristic of the speaker unit undergo convolution operations previously, and the result thereof is made to be new factor data so as to construct the FIR type digital filter.

Referring to FIG. 19, reference numbers $67_1, 67_2 \ldots 67n$ represent a high pass/characteristic compensating FIR type filters for the above-mentioned object, and reference numbers $67_{11}, 67_{22} \ldots 67nn$ designate factor generating circuits of the high pass/characteristic compensating filter having new factor data obtained from the result of the convolution operations.

Figure 20:
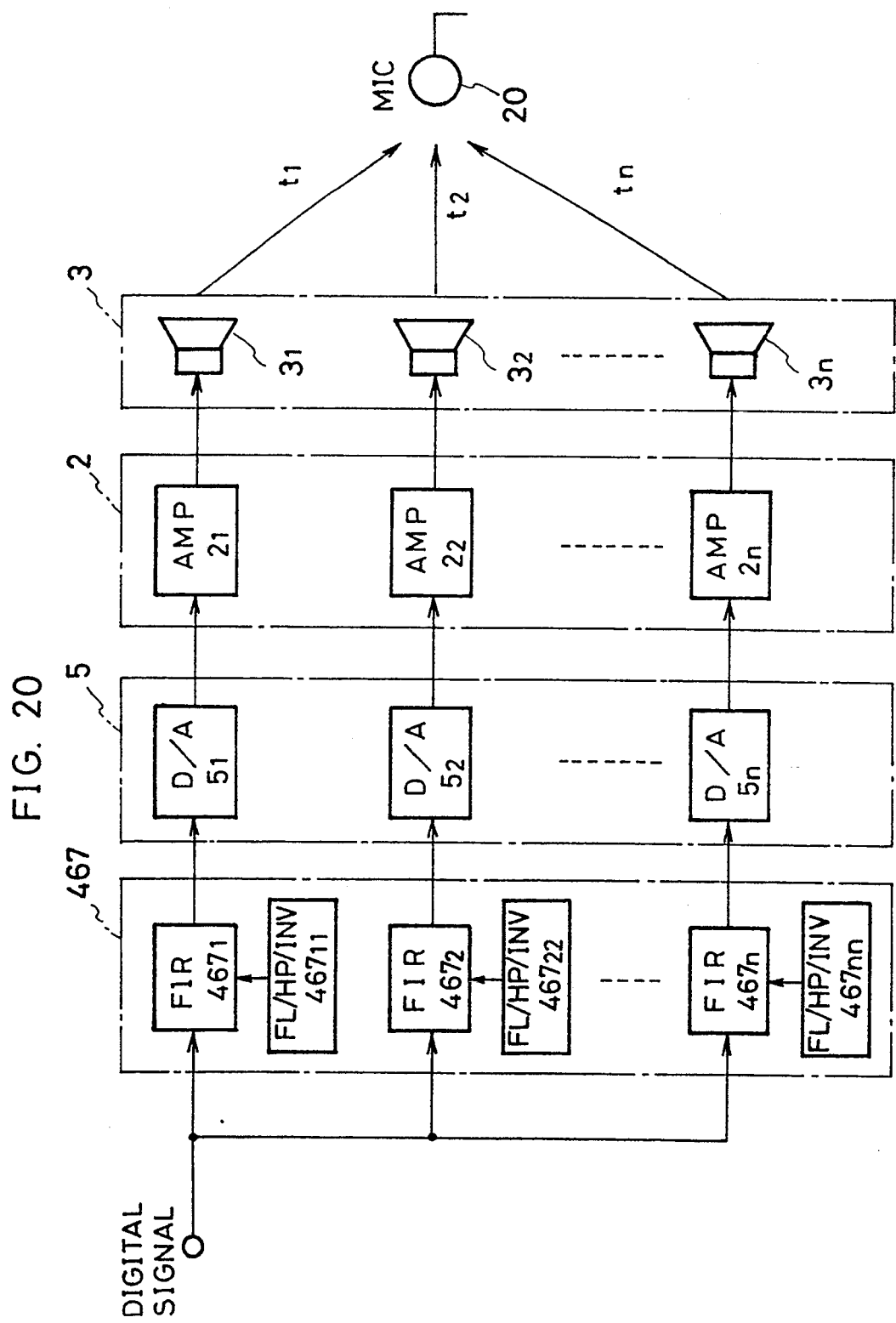
FIG. 20 is a block diagram showing a further embodiment according to the present invention.

FIG. 20 is a block diagram showing the embodiment of the acoustic system of the present invention, in which the digital channel divider is used in the multi-channel amplifier type speaker system.

Referring to FIG. 20, the basic operation is the same in FIGS. 17 and 19. With the same reason, the fidelity-wise reproduction of the sound signals and the prevention of the excessive input can be realized simultaneously.

A point different from FIGS. 17 and 19 is that a frequency band dividing/high pass/characteristic compensating filter 67 is provided, which is an integration of the frequency band dividing circuit 4, the digital high pass filter 6, and the characteristic compensating inverse filter 7.

Here, meaning of the integration is same as the above. That is, the frequency band dividing circuit 4 and the digital high pass filter 6 are realized by the FIR type filter, whose filter factor data are previously calculated with convolution operations, and further, the result of the convolution operations and the factor data of the factor generating circuits $7_{11}, 7_{22} \ldots 7nn$ which give inverse characteristic of the speaker unit are calculated by convolution operations, so that the result of the convolution operations obtained finally is made to be new factor data for constructing FIR type digital filter.

Referring to FIG. 20, reference numbers $467_1, 467_2 \ldots 467n$ represent a frequency band dividing/high pass/characteristic compensating FIR type filter, and reference numbers $467_{11}, 467_{22} \ldots 467nn$ represent a factor generating circuit for the frequency band dividing/high pass/characteristic compensating filter having new factor data obtained as a result of the convolution operations.

As described above, the digital channel divider of the present invention is provided with the characteristic compensating inverse filter for producing the flat overall sound pressure frequency response and realizing the linear phase frequency response and is provided with the digital high pass filter for reducing the input at below the lowest resonance frequency, thereby realizing the fidelity-wise reproduction of the sound signals and preventing the excessive input in the speaker unit.

What is claimed is:

1. An acoustic system having a plurality of channels, each channel corresponding to a frequency band and each having a digital signal processing circuit section, an exclusive power amplifier, said exclusive power amplifier receiving a processed signal from said digital signal processing circuit section and outputting an amplified signal, and a speaker unit, said speaker unit receiving said amplified signal, said acoustic system including a microphone for receiving output signals from said speaker units, each digital signal processing circuit section comprising:
an A/D converter for receiving an input signal and outputting a digital signal,
a digital band dividing circuit, receiving said digital signal and outputting a divided signal,
a digital inverse filter for receiving said divided signal and outputting a flattened signal,
a digital delay time compensating circuit, receiving said flattened signal and outputting a delayed signal, and
a D/A converter for receiving said delayed signal and outputting said processed signal,
each digital band dividing circuit having a first filter factor and means for performing real time convolution operations of said digital signal and said first filter factor, the first filter factor providing a frequency band dividing characteristic, so as to produce said divided signal,
each digital inverse filter having a second filter factor and means for performing real time convolution operations of said divided signal and the second filter factor, the second filter factor providing an inverse characteristic of an output sound pressure characteristics of the speaker unit, so as to produce said flattened signal, and
wherein each said digital delay time compensating circuit causes a delay time such that said microphone simultaneously receives output signals from each speaker unit, each output signal originating from said input signal.

2. The acoustic system according to claim 1, wherein said digital delay time compensating circuit includes a buffer memory and a delay control circuit, wherein the digital delay time compensating circuit temporarily stores said flattened signal in the buffer memory by using the delay control circuit, and outputs a delayed version of the flattened signal after a fixed time as said delayed signal.

3. The acoustic system according to claim 1, wherein said digital delay time compensating circuit performs real time convolution operations of input signals and delay factors by means of linear phase FIR filter.

4. An acoustic system having multiple frequency bands and for each frequency band having a digital signal processing circuit section, an exclusive power amplifier and a speaker unit responsive to the amplifier wherein each digital signal processing circuit section comprises
(a) an A/D converter receiving an input signal,
(b) an integrated FIR type filter for performing convolution operations of a first filter factor, which gives a frequency band dividing characteristic, and a second filter factor, which gives an inverse characteristic of an output sound pressure characteristic of the speaker unit, and for further performing real time convolution operations of factor data resulting from said convolution operations and a converted signal from said A/D converter, and
(c) a D/A converter for receiving a filtered signal from said FIR type filter and for outputting an analog signal to the power amplifier, the acoustic system further comprising a microphone for receiving output signals from said speaker units and a digital delay time compensating circuit for creating delay times for each channel such that said microphone simultaneously receives said output signals, each originating from the same input signal.

5. An acoustic system for a multi-channel amplifier type speaker system having a digital signal processing circuit section, an exclusive power amplifier, and a speaker unit for each frequency channel and a microphone, wherein each digital signal processing circuit section comprises a digital band dividing circuit, a digital inverse filter for flattening output sound pressure characteristics of the speaker unit, and a D/A converter, and wherein each digital band dividing circuit has means for performing real time convolution operations of an input signal and a filter factor which provides a frequency band dividing characteristic, each digital inverse filter has means for performing real time convolution operations of an input signal and a filter factor which provides an inverse characteristic of the output sound pressure characteristics of the speaker units, said system further comprising;
a digital delay time compensating circuit for causing delay times for each channel such that input signals reach said microphone through the digital band dividing circuit, the exclusive amplifiers, and the speaker units simultaneously, and a linear phase FIR type filter for modifying an overall sound pressure characteristic of each channel according to a second filter factor, disposed prior to said digital signal processing circuit section.

6. An acoustic system for a multi-channel amplifier type speaker system for creating an output sound responsive to an input signal, each channel having a digital signal processing circuit section, an exclusive power amplifier, and speaker unit, the system further having a microphone, at least one digital signal processing circuit section comprising a decimation circuit, digital frequency band dividing circuit, a characteristic compensating inverse filter for flattening output sound pressure characteristics of the speaker unit, and a D/A converter, wherein said digital frequency band dividing circuit has means for performing real time convolution operations of a digital input signal and a filter factor which gives a frequency band dividing characteristic, said system further comprising;
a characteristic compensating inverse filter for performing real time convolution operations of the input signal and the filter factor which gives an inverse characteristic of output sound pressure characteristics of the speaker unit, and a delay time compensating circuit for adjusting delay time differences among the channels such that the portion of said output sound from each channel reaches said microphone simultaneously receiving output sounds, originating from the same input signal.

7. The acoustic system according to claim 6 wherein the digital signal processing circuit section comprises an interpolation circuit disposed prior to said D/A converter for setting a sampling frequency of said D/A converter which is equal to the digital input signal frequency.

8. The acoustic system according to claim 6 or 7 wherein the digital delay time compensating circuit comprises a memory for storing a digital signal temporarily and a delay time processing circuit section for outputting the stored digital signal after a fixed time.

9. The acoustic system according to claim 6 or 7, wherein the digital delay time compensating circuit performs real time convolution operations of the digital input signal and the delay factor by means of the linear phase type FIR filter.

10. The acoustic system according to claim 6 wherein the filter factor which provides the frequency band dividing characteristic and the filter factor which provides the inverse characteristic of the output sound pressure characteristic of the speakers undergo convolution operations, and wherein the frequency band dividing circuit and the inverse filter are integrated and perform real time convolution operations of the input signal and the factor data resulting from the convolution operations by means of the FIR filter.

11. The acoustic system according to claim 6 or 7 wherein the filter factor which provides the frequency band dividing characteristic, the filter factor which provides the inverse characteristic of the output sound pressure characteristic of the speaker units, and the delay compensating factor of the delay time compensating circuit undergo convolution operations prior to the FIR type filter performing the real time convolution operations of the input signal and the factor data resulted from the convolution operations, so that the frequency band dividing circuit, inverse filter, and delay compensating circuit are integrated.

12. The acoustic system according to claims 6 7 wherein the decimation circuit comprises a FIR type anti-aliasing filter, a decimation filter factor generating circuit, and a decimation processing section for thinning out the digital data.

13. The acoustic system according to claims 6 or 7 wherein a linear phase type FIR filter and a filter factor generating circuit for modifying an overall sound pressure characteristic of each channel according to a filter factor stage prior to the decimation circuit, so that the real time convolution operations of the digital input signal and the filter factor which provides the inverse characteristic of the overall sound pressure characteristic or an optional characteristic is performed by means of the linear phase type FIR filter.

14. The acoustic system according to claim 12 wherein an A/D converter comprising the anti-aliasing filter is provided at a stage prior to the digital signal processing circuit section.

15. The acoustic system according to claim 9, wherein the filter factor which provides the frequency band dividing characteristic and the filter factor which provides the inverse characteristic of the output sound pressure characteristic of the speakers undergo convolution operations, and wherein the frequency band dividing circuit and the inverse filter are integrated and perform real time convolution operations of the input signal and the factor data resulting from the convolution operations by means of the FIR filter.

16. An acoustic system having a plurality of filters connected in parallel, the filters corresponding to a plurality of channels each channel corresponding to a frequency band each channel setting a desired transmission frequency response for a digital input signal, wherein a signal is outputted from each filter independently, wherein at least one of said parallel filters comprises:
an inverse filter for providing an inverse characteristic of a sound pressure frequency characteristic of a speaker unit connected to each channel, each speaker unit having a lowest resonance frequency and a digital high pass filter having a cut-off frequency of approximately the lowest resonance frequency of the speaker units and wherein sound waves of the speaker units are supplied to a microphone.

17. The acoustic system according to claim 16 wherein said inverse filter supplies the inverse characteristic of the overall transmission frequency response of the corresponding channel from said digital input signal to said microphone excepting the digital high pass filter and the sound pressure characteristic compensating inverse filter of the speaker units.

18. The acoustic system according to claim 16, wherein said digital high pass filter eliminates a direct current input to be loaded to the speaker units.

19. The acoustic system according to claim 16 or 17 or 18, wherein the FIR type filter is used as a digital high pass filter and an inverse filter.

20. The acoustic system according to claims 16, 17 or 18, wherein said inverse filter is an FIR type digital filter having factor data and the digital high pass filter and the factor data of the FIR type digital filter are convoluted, so that said digital high pass filter and inverse filter comprise a single FIR type filter in at least one channel.

21. The acoustic system according to claims 16, 17 or 18, wherein a circuit comprising the frequency band dividing circuit, the digital high pass filter and the inverse filter in at least one channel comprises a FIR type digital filter, the FIR type digital filter having convoluted factor data.

22. An acoustic system for a multi-channel amplifier type speaker system, wherein each channel has a digital signal processing circuit section, an exclusive power amplifier, and a speaker unit, said acoustic system including a microphone for receiving output signals from said speaker units and wherein each of said channels corresponds to a frequency band; and wherein each digital signal processing circuit section comprises:
an A/D converter,
a digital band dividing circuit having a first filter factor and having means for performing real time convolution operations of signals from the A/D converter and the first filter factor to provide an output signal corresponding to a predetermined frequency band;
a digital inverse filter having a second filter factor generating circuit that is responsive to the microphone, wherein the digital inverse filter has means for performing real time convolution operations of the output signal from the digital band dividing circuit and a second filter factor, generated by the second filter factor generating circuit, wherein the second filter factor gives an inverse characteristic of an output sound pressure characteristic of the speaker unit;
a D/A converter, and
a digital delay time compensating circuit disposed prior to the D/A converter, wherein said digital delay time compensating circuit has a delay time such that all input signals to all channels reach said microphone simultaneously.

23. An acoustic system according to claim 22, wherein said digital delay time compensating circuit temporarily stores a digital input signal in a buffer memory by using a delay control circuit, and outputs said digital input signal after a fixed time.

24. The acoustic system according to claim 22 wherein the filter factor which provides the frequency band dividing characteristic and the second filter factor which provides the inverse characteristic of the output sound pressure characteristic of the speakers undergo convolution operations, and wherein the frequency band dividing circuit and the inverse filter are integrated.

25. The acoustic system according to claim 22 further comprising a decimation circuit for each channel, wherein the decimation circuit comprises a FIR type anti-aliasing filter, a decimation filter factor generating circuit, and a decimation processing section for thinning out the digital data.

26. The acoustic system according to claim 25, wherein each digital signal processing circuit section further comprises an interpolation circuit disposed prior to said D/A converter for setting a sampling frequency of said D/A converter which is equal to the digital input signal frequency.

27. An acoustic system, having a plurality of channels, each channel corresponding to a frequency band comprising:
a plurality of digital band dividing circuits, each receiving a digital input signal, and each having means for performing a real time convolution operation of the received digital input signal and a filter factor, each filter factor corresponding to each of the plurality of digital band dividing circuits has a characteristic so as to divide the received digital input signal into said frequency band, so that each of the plurality of digital dividing circuits provides a divided signal for a different frequency band;

a plurality of digital inverse filters, each digital inverse filter receiving a divided signal from a corresponding digital band dividing circuit, and each having means for performing a real time convolution operation of the received divided signal and a second filter factor, the second filter factor having a characteristic that is an inverse of an output sound pressure characteristic of a corresponding speaker unit; and a plurality of digital delay time compensating circuits, each receiving a flattened signal from a corresponding digital inverse filter, and each having means for causing a delay time in the corresponding channel such that output signals for each channel, originating from the same digital input signal are output simultaneously.

* * * * *